(12) United States Patent
Komatsu

(10) Patent No.: US 10,903,826 B2
(45) Date of Patent: Jan. 26, 2021

(54) GLITCH REMOVAL CIRCUIT AND ELECTRONIC DEVICE

(71) Applicant: FANUC CORPORATION, Yamanashi (JP)

(72) Inventor: Takaaki Komatsu, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/784,968

(22) Filed: Feb. 7, 2020

(65) Prior Publication Data

US 2020/0280305 A1     Sep. 3, 2020

(30) Foreign Application Priority Data

Feb. 28, 2019    (JP) ................................. 2019-036357

(51) Int. Cl.
    *H03K 5/1252*       (2006.01)
    *H03K 5/135*        (2006.01)
    *H03K 19/003*       (2006.01)

(52) U.S. Cl.
    CPC ........... *H03K 5/1252* (2013.01); *H03K 5/135* (2013.01); *H03K 19/00369* (2013.01)

(58) Field of Classification Search
    CPC ...... H03K 5/1252; H03K 5/135; H03K 3/013; H03K 3/0375; H03K 17/22; H03K 17/223; H03K 19/00369; G01R 29/0273; G06F 1/24
    See application file for complete search history.

(56) References Cited

U.S. PATENT DOCUMENTS 6,745,337 B1 *    6/2004    Trivedi ............... G06F 13/4072
                                                                           713/400
8,729,934 B2 *    5/2014    Osada .................. H03K 5/1252
                                                                           327/142

FOREIGN PATENT DOCUMENTS

JP           2009225153 A     10/2009

* cited by examiner

*Primary Examiner* — Long Nguyen
(74) *Attorney, Agent, or Firm* — Studebaker & Brackett PC

(57) ABSTRACT

A glitch removal circuit removes glitch noise contained in a Power-good signal and a Power-on Reset signal, and includes: a first glitch removal unit that operates according to a first clock signal, and removes glitch noise from a Power-good signal; and a second glitch removal unit that operates according to a second clock signal, and removes glitch noise from a Power-on Reset signal, in which the first glitch removal unit is configured so as to be initialized according to an output signal of the second glitch removal unit, and the second glitch removal unit is configured so as to be initialized according to an output signal of the first glitch removal unit.

6 Claims, 32 Drawing Sheets

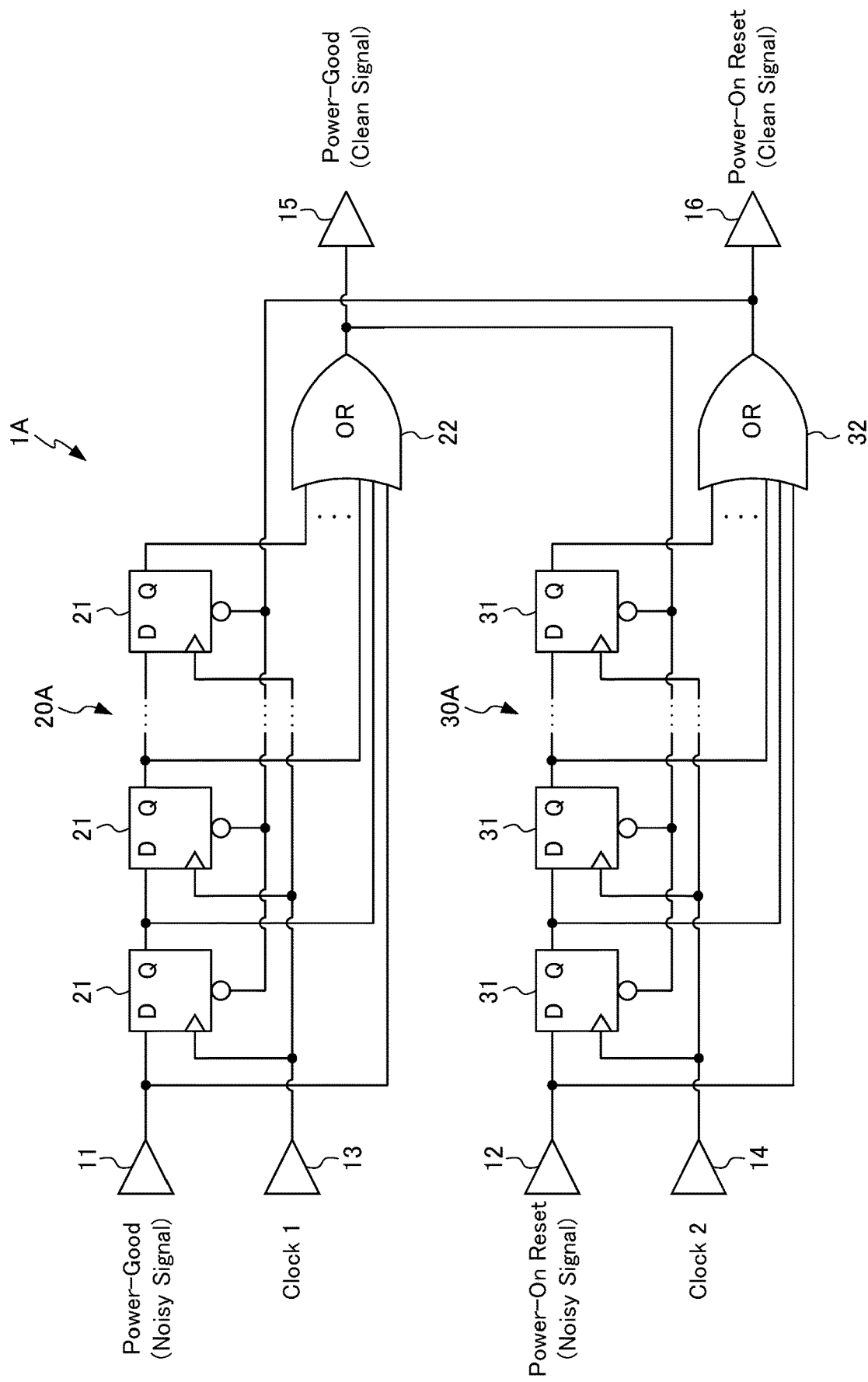

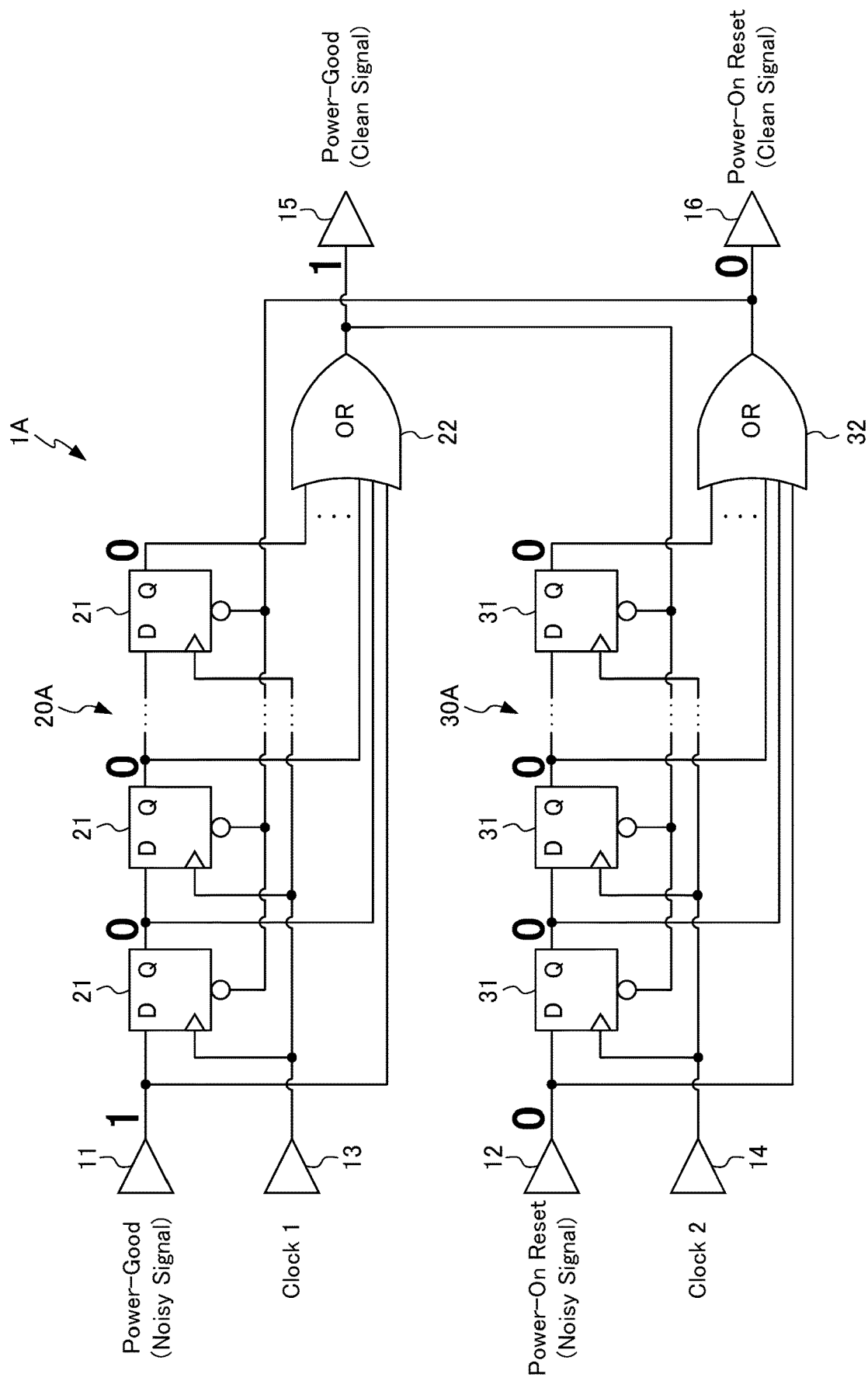

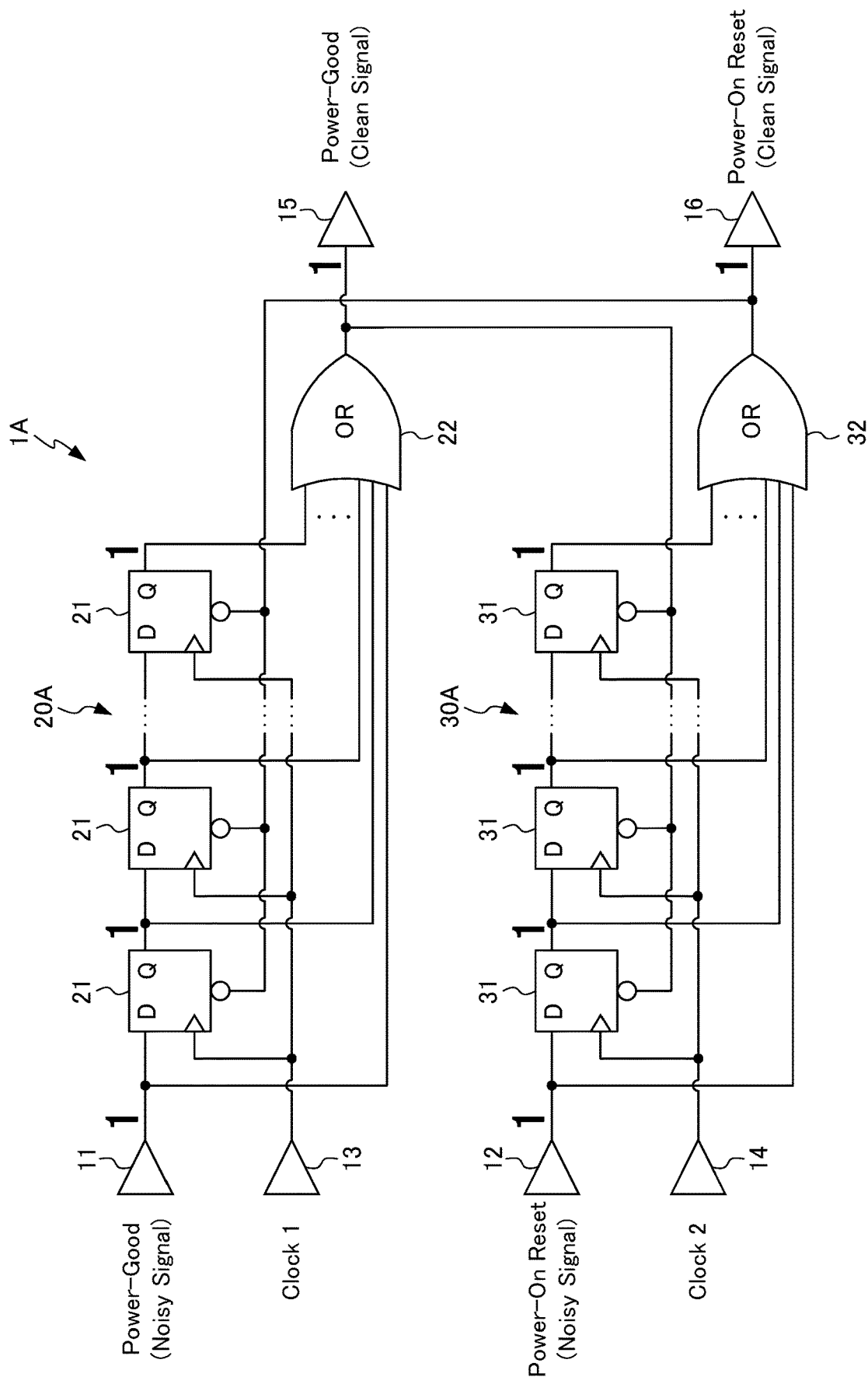

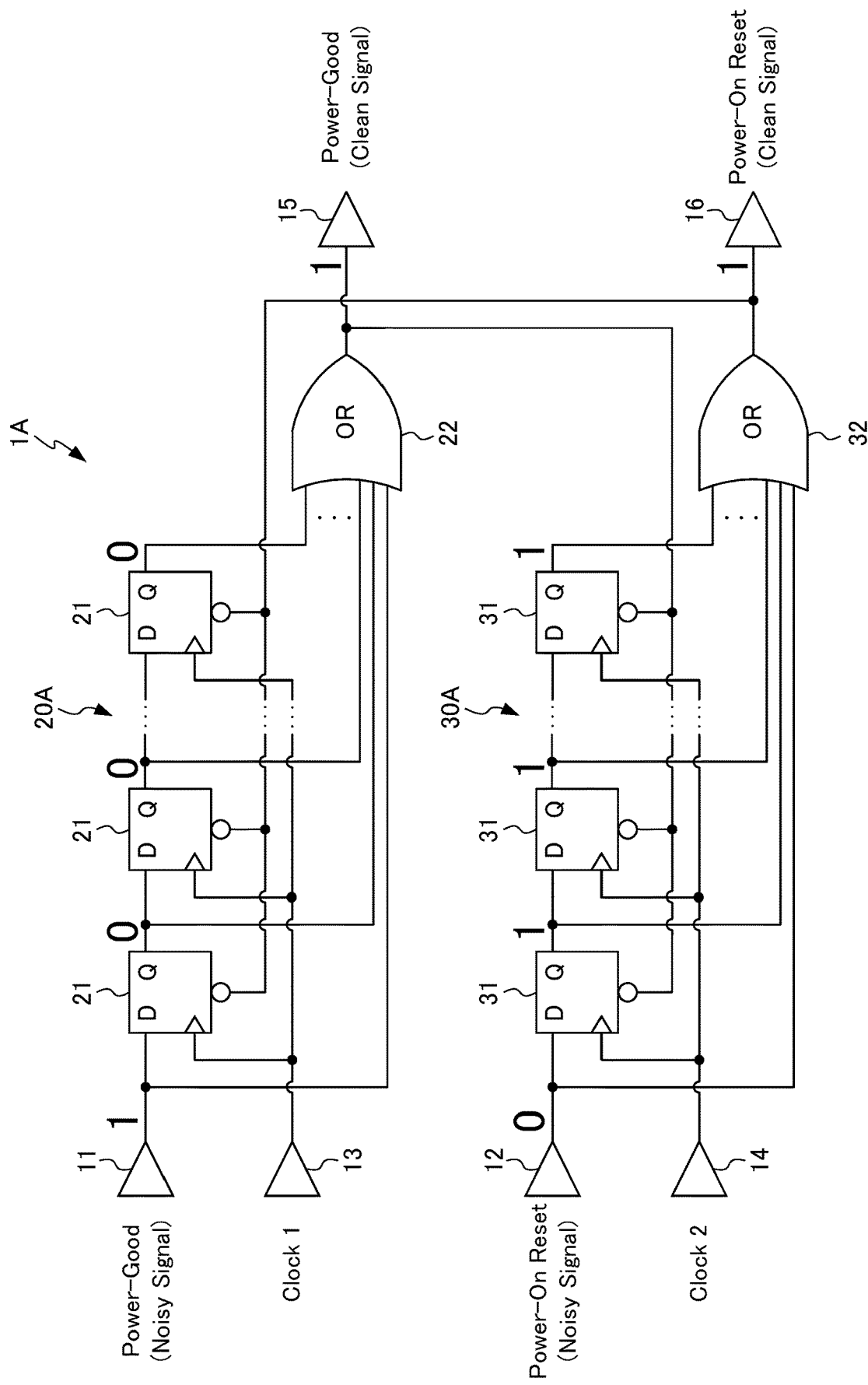

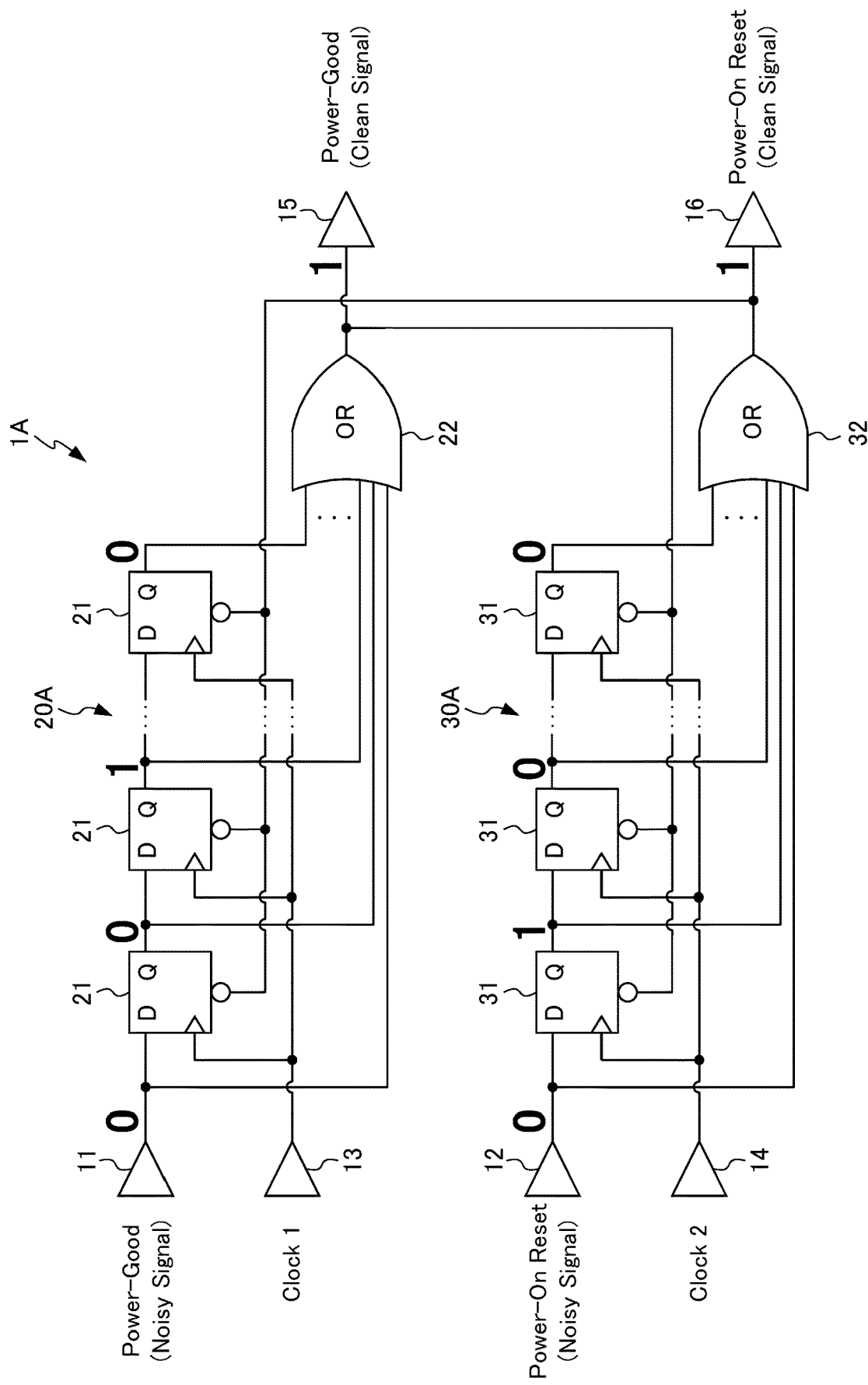

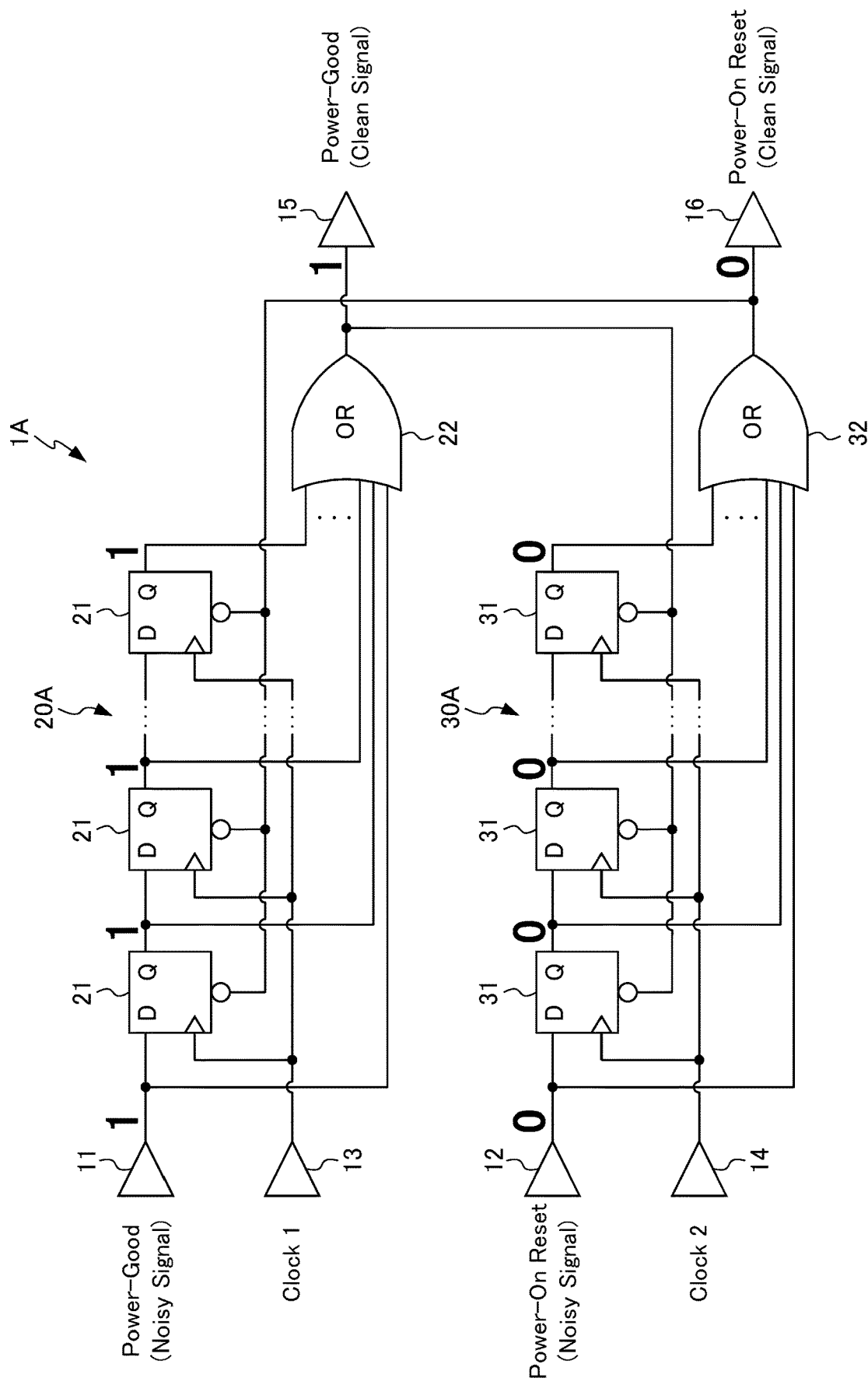

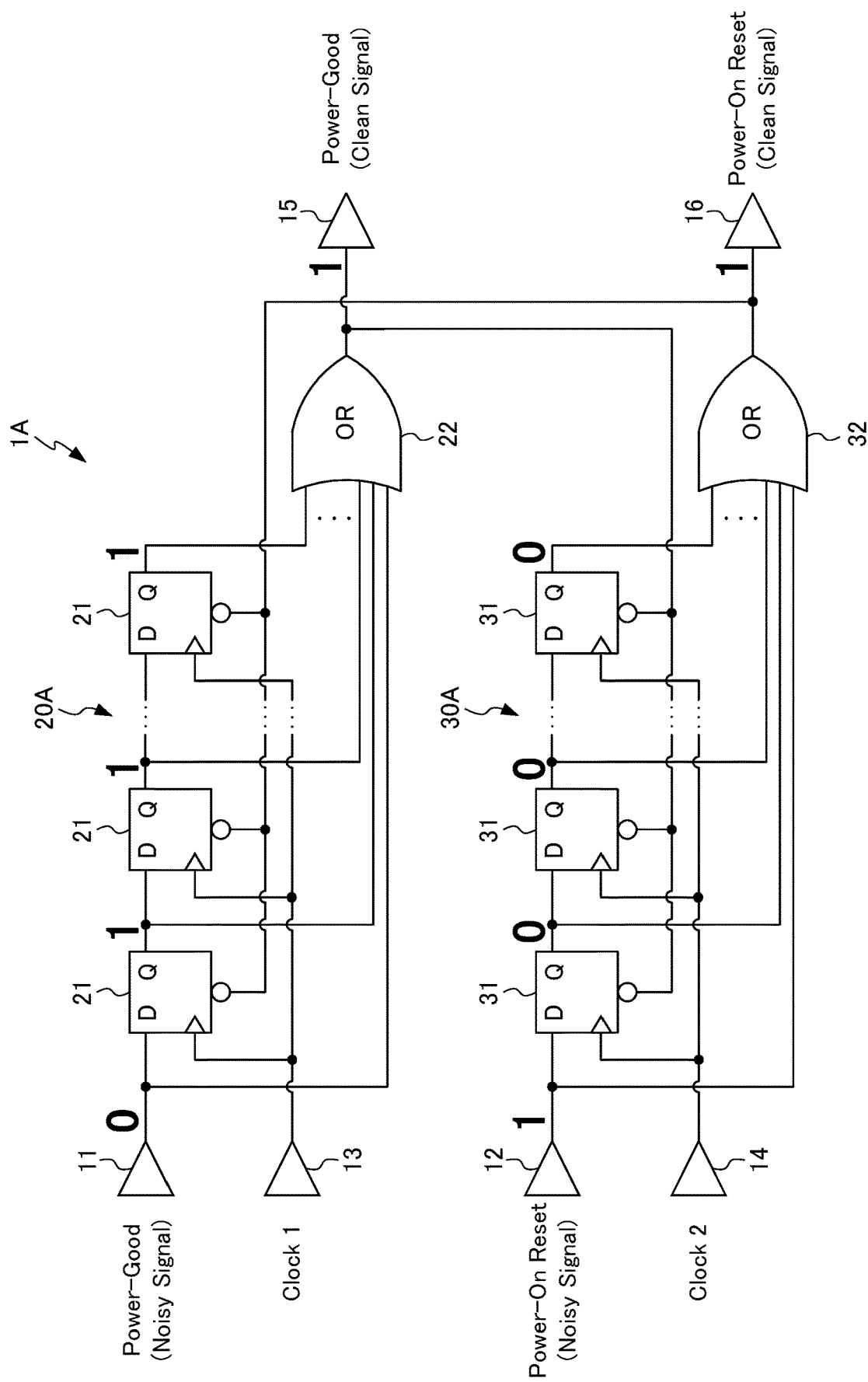

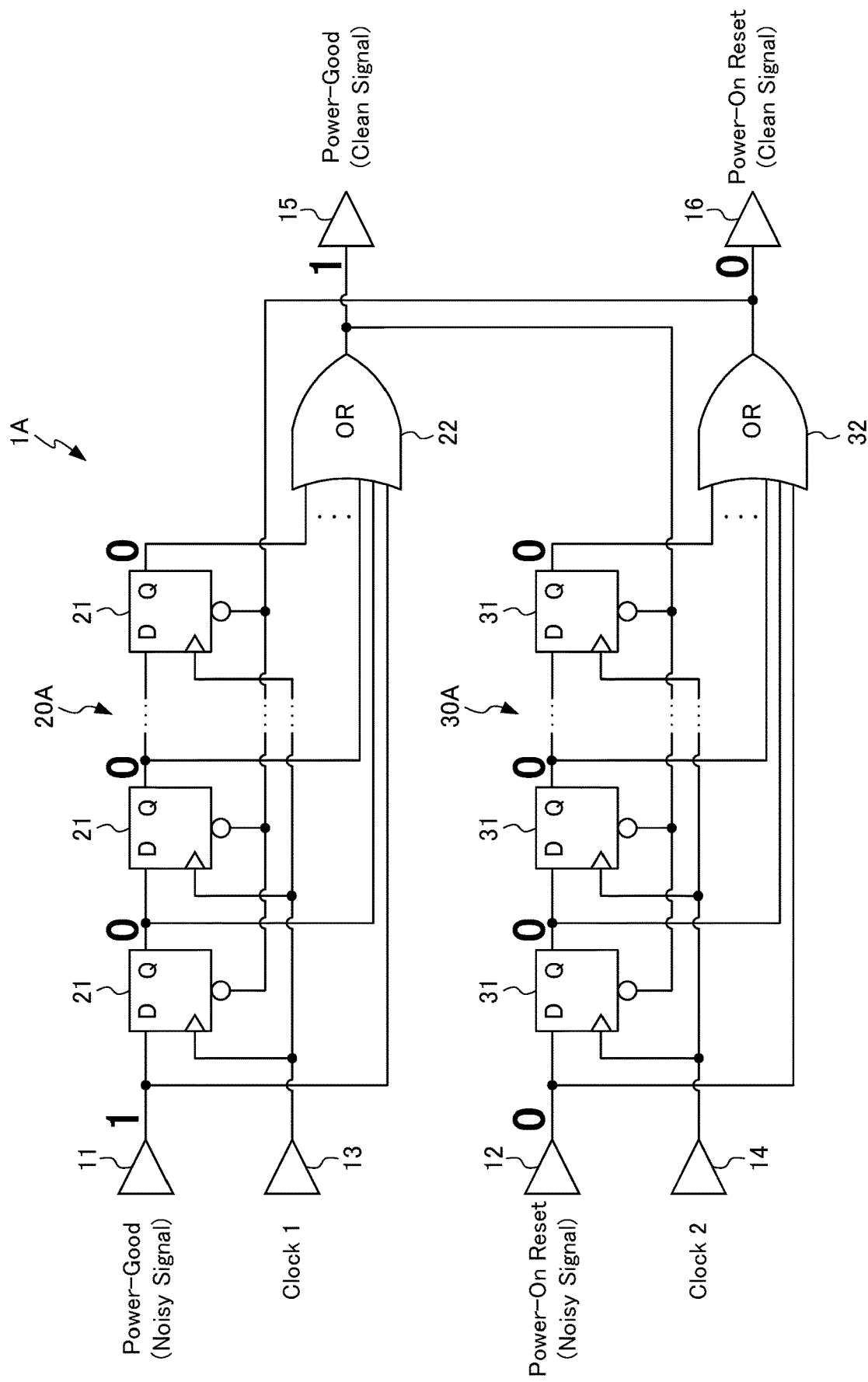

GLITCH REMOVAL CIRCUIT AND ELECTRONIC DEVICE

This application is based on and claims the benefit of priority from Japanese Patent Application No. 2019-036357, filed on 28 Feb. 2019, the content of which is incorporated herein by reference.

BACKGROUND OF THE INVENTION

Field of the Invention

The present invention relates to a glitch removal circuit and an electronic device.

Related Art

In electrical circuits, pulse noise of a whisker shape shorter than the normal pulse width is called a glitch. In logical circuits, if two input signals change in adjacent times, glitches may occur in the output. This is a phenomenon caused by the signal delay time of two signals, and is called racing.

In addition, when a plurality of output terminals in an integrated circuit or the like changes in the same direction simultaneously, racing may occur in adjacent terminals, and this is called simultaneous switching noise. As a separate example, in the case of there being two signals running parallel, a glitch may occur in the other when one changes, and this is called crosstalk. Even apart from this, a glitch can occur for various causes such as electrostatic discharge or a radiation field.

These glitches adversely affect logical circuits in the following stage. Therefore, a glitch removal circuit has been proposed which has a plurality of flip flops (elements retaining information) and removes glitch noise by configuring the value of original signals of a plurality of clock cycles (for example, refer to Patent Document 1).

Patent Document 1: Japanese Unexamined Patent Application, Publication No. 2009-225153

SUMMARY OF THE INVENTION

Generally, a digital circuit which uses elements that retain information such as flip flop is configured so as to be initialized upon startup. More specifically, the digital circuit is always initialized according to a Power-on Reset signal outputted when the power supply voltage is stabilized. However, in the case of glitch noise being contained in the Power-on Reset signal which initializes the glitch removal circuit made using flip flop, there is concern over the glitch removal circuit not being able to operate normally. For this reason, technology which can remove glitch noise contained in the Power-on Reset signal has been desired.

A glitch removal circuit according to an aspect of the present disclosure is a glitch removal circuit which removes glitch noise contained in a Power-good signal and a Power-on Reset signal, the glitch removal circuit including: a first glitch removal unit that operates according to a first clock signal, and removes glitch noise from a Power-good signal; and a second glitch removal unit that operates according to a second clock signal, and removes glitch noise from a Power-on Reset signal, in which the first glitch removal unit is configured so as to be initialized according to an output signal of the second glitch removal unit, and the second glitch removal unit is configured so as to be initialized according to an output signal of the first glitch removal unit.

The glitch removal circuit according to an aspect of the present disclosure can remove glitch noise contained in a Power-on Reset signal.

BRIEF DESCRIPTION OF THE DRAWINGS

FIG. 2 is a circuit diagram showing a glitch removal circuit according to a second embodiment of the present disclosure;

FIG. 3D is a circuit diagram showing signal levels subsequent to FIG. 3C;

FIG. 3G is a circuit diagram showing signal levels subsequent to FIG. 3F;

FIG. 5G is a circuit diagram showing signal levels subsequent to FIG. 5F;

FIG. 7A is a circuit diagram adding signal levels of each part during second clock signal stoppage of the glitch removal circuit in FIG. 2;

FIG. 7E is a circuit diagram showing signal levels subsequent to FIG. 7D;

FIG. 7G is a circuit diagram showing signal levels subsequent to FIG. 7F;

FIG. 7H is a circuit diagram showing signal levels subsequent to FIG. 7G;

DETAILED DESCRIPTION OF THE INVENTION

Figure 1:
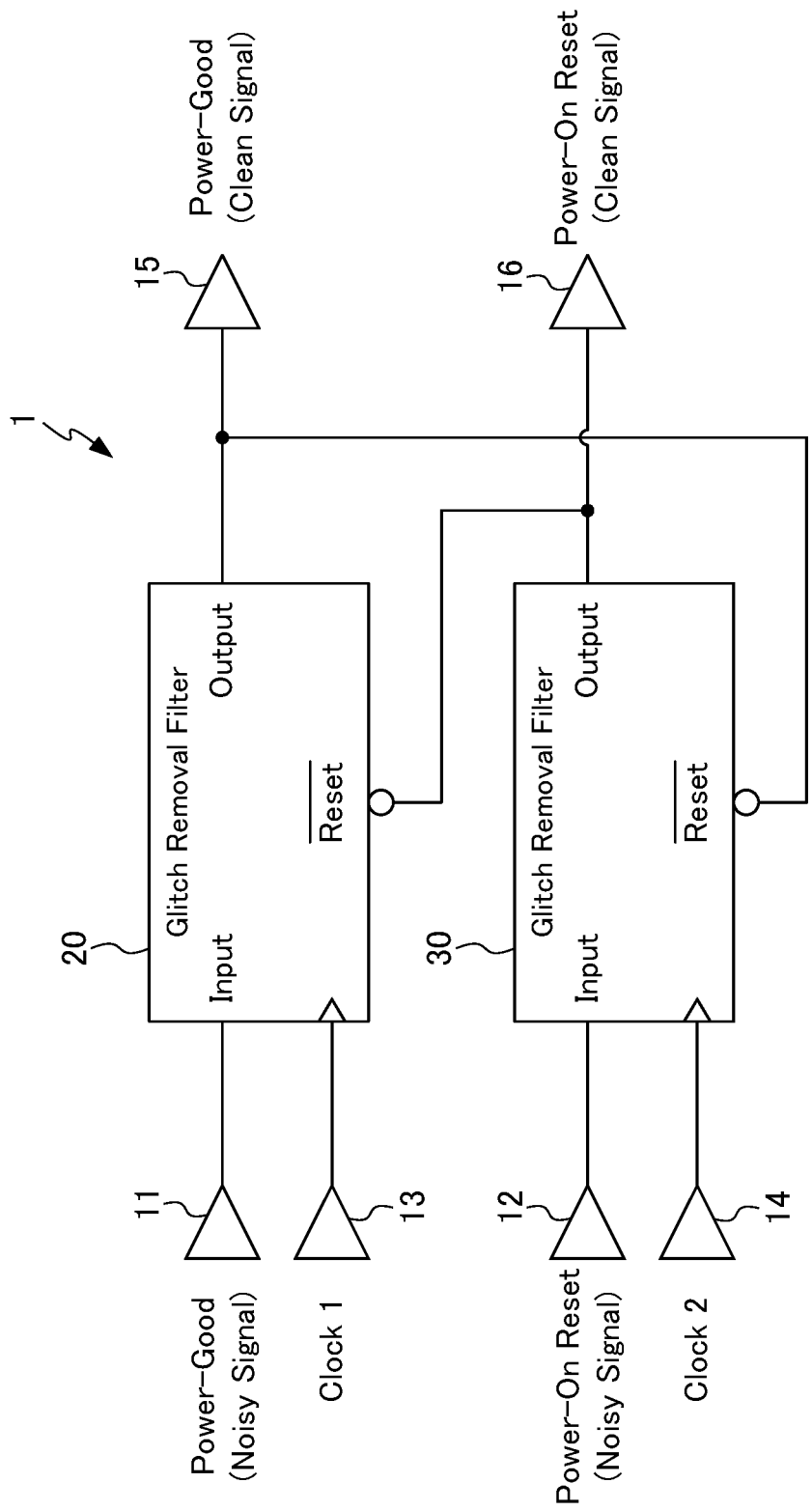
FIG. 1 is a circuit diagram showing a glitch removal circuit according to a first embodiment of the present disclosure.

Hereinafter, an embodiment of the present disclosure will be explained while reference the drawings. FIG. 1 is a circuit diagram showing a glitch removal circuit 1 according to a first embodiment of the present disclosure. The glitch removal circuit 1 removes glitch noise contained in a Power-good signal and Power-on Reset signal. It should be noted that, in the following explanation, "glitch noise" may be explained simply as "glitch".

The glitch removal circuit 1 includes: a first input terminal 11 to which an original signal of the Power-good signal (signal which may include glitch noise) is inputted; a second input terminal 12 to which a original signal of the Power-on Reset signal (signal which may include glitch noise) is inputted; a first clock terminal 13 to which a cyclic first clock signal is inputted; a second clock terminal 14 to which a cyclic second clock signal is inputted; a first glitch removal unit 20 which operates according to the first clock signal and removes glitch noise from the Power-good signal; a second glitch removal unit 30 which operates according to the second clock signal and removes glitch noise from the original signal of the Power-on Reset signal; a first output terminal 15 which outputs an output signal of the Power-good signal from which the first glitch removal unit 20 removed glitch noise; and a second output terminal 16 which outputs an output signal of the Power-on Reset signal from which the second glitch removal unit 30 removed glitch noise.

The first input terminal 11, second input terminal 12, first clock terminal 13, second clock terminal 14, first output terminal 15 and second output signal 16 are units conceptually showing the boundary between the glitch removal circuit 1 and external circuits. Therefore, the first input terminal 11, second input terminal 12, first clock terminal 13, second clock terminal 14, first output terminal 15 and second output signal 16 may not necessarily have physical structures for connecting such as wiring, and may not necessarily be elements which can by specified physical by positions on an actual circuit.

The first glitch removal unit 20 can be established as a digital circuit which stores the values (signal levels) of the original signal of the Power-good signal from n (n is a positive integer) previous until a current cycle of the first clock, and outputs an output signal from which a change in value in a short time due to glitch has been removed based on the values of the n-times past original signals. In addition, the first glitch removal unit 20 is configured so as to be initialized in the case of the output signal of the second glitch removal unit 30 becoming the low level. More specifically, the first glitch removal unit 20 is configured so that the value stored n-times past of the original signal returns to the initial value, in the case of the output signal of the second glitch removal unit 30 (Power-on Reset signal from which glitch was removed by the second glitch removal unit 30) becoming the low level.

The second glitch removal unit 30 can be established as a well-known digital circuit which stores the values of the original signal of the Power-on Reset signal from the previous m-times until current of the cycles of the second clock, and outputs an output signal from which a change in value in a short time due to a glitch was removed, based on the value of the original signal of the past m-times (m is a positive integer). In addition, the second itch removal unit 30 is configured so as to be initialized in the case of the output signal of the first glitch removal unit 20 becoming the low level. More specifically, the second glitch removal unit 30 is configured so that the stored value of the past m-times of the original signal is returned to the initial value, in the case of the output signal of the first glitch removal unit 20 (Power-good signal from which glitch was removed by the first glitch removal unit 20) becoming the low level.

The first clock signal inputted to the first clock terminal 13 and the second clock signal inputted to the second clock terminal 14, for example, can be given from a clock generation source such as a crystal oscillator. The first clock signal and second clock signal may be the same signal generated from a single clock generation source; however, they are preferably generated by clock generation sources which differ from each other. It is thereby possible to reduce the possibility of abnormalities occurring at the same time in the first clock signal and second clock signal. The glitch removal circuit 1 can remove fixed glitch noise, even if one of the first clock signal and second click signal stop, so long as the other one is normal. For this reason, by the generation sources of the first clock signal and second signal being different, it is possible to minimize the risk of functions of the glitch removal circuit 1 being completely lost.

The first clock signal preferably stabilizes prior to a rising of the original signal of the Power-good signal. It is thereby possible to initialize the second glitch removal unit 30 by the first glitch removal unit 20 outputting the low level, prior to a rising of the Power-good signal. The second clock signal preferably stabilizes prior to a negation of the original signal of the Power-on Reset signal (transitioning from low level to high level). It is thereby possible for the second glitch removal unit 30 to output the low level prior to a negation of the original signal of the Power-on Reset signal, and appropriately initialize the succeeding digital circuit according to the output signal of the Power-on Reset outputted from the second output terminal 16 of the glitch removal circuit 1. In addition, the second clock signal preferably stabilizes prior to a negation of the original signal of the Power-good signal. It is thereby possible to initialize the first glitch removal unit 20 appropriately prior to a negation of the Power-good signal.

In addition, so long as the first clock signal and second clock signal are both clock signals which stabilize prior to a rising of the original signal of the Power-good signal, it is possible to initialize the second glitch removal unit 30 by the first glitch removal unit 20 outputting the low level prior to a rising of the Power-good signal, and reset/initialize the first glitch removal unit 20 by the second glitch removal unit 30 outputting the low level. It is thereby possible to appropriately remove glitch noise from the original signal of the Power-good signal by the first glitch removal unit 20, and possible to appropriately remove glitch noise from the original signal of the Power-on. Reset signal by the second glitch removal unit 30.

In the above way, the glitch removal circuit 1 according to the present embodiment includes: the first glitch removal unit 20 which removes glitch noise from the original signal of the Power-good signal, and the second glitch removal unit 30 which removes glitch noise from the original signal of the Power-on Reset signal. The glitch removal circuit 1 can thereby output two output signals from which glitch noise was respectively removed from the original signal of the Power-good signal and the original signal of the Power-on Reset signal.

In addition, in the glitch removal circuit 1, the first glitch removal unit 20 is initialized in the case of the output signal of the second glitch removal unit 30 becoming the low level, and the second glitch removal unit 30 is initialized in the case of the output signal of the first glitch removal unit 20 becoming the low level. With the glitch removal circuit 1, even in a case of the original signal of the Power-good signal or the original signal of the Power-on Reset signal including glitch noise, since the first glitch removal unit 20 and second glitch removal unit 30 are prevented from mistakenly being initialized, it is thereby possible to output an accurate output signal of the Power-good signal and output signal of the Power-on Reset signal respectively prepared by simply removing glitch noise from the original signal of the Power-good signal and original signal of the Power-on Reset signal.

Next, a second embodiment of the present disclosure will be explained. FIG. 2 is a circuit diagram showing a glitch removal circuit 1A according to the second embodiment of the present disclosure.

The glitch removal circuit its includes: a first input terminal 11 to which an original signal of the Power-good signal is inputted; a second input terminal 12 to which an original signal of the Power-on Reset signal is inputted; a first clock terminal 13 to which a cyclic first clock signal is inputted; a second clock terminal 14 to which a cyclic second clock signal is inputted; a first glitch removal unit 20A which operates according to the first clock signal and removes glitch noise from the Power-good signal; a second glitch removal unit 30A which operates according to the second clock signal and removes glitch noise from the original signal of the Power-on Reset signal; a first output terminal 15 which outputs an output signal of the Power-good signal from which the first glitch removal unit 20A removed glitch noise; and a second output terminal 16 which outputs an output signal of the Power-on Reset signal from which the second glitch removal unit 30A removed glitch noise.

The first input terminal 11, second input terminal 12, first clock terminal 13, second clock terminal 14, first output terminal 15 and second output terminal 16 in the glitch removal circuit 1A according to the second embodiment are the same as the first input terminal 11, second input terminal 12, first clock terminal 13, second clock terminal 14, first output terminal 15 and second output, terminal 16 in the glitch removal circuit 1 according to the first embodiment.

The first glitch removal unit 20A has n-stages (n is a positive integer) of first delay elements 21; and a first logical circuit 22 which outputs the logical sum (operation result) of the outputs of each stage of the n-stages of first delay elements 21 and the current input signal (current original signal of Power-good signal).

The n-stages of first delay elements 21 can respectively be configured from D-flip flops having an input terminal, output terminal, clock terminal and asynchronous reset terminal.

Among the n-stages of first delay elements 21, the input terminal of the first stage of the first delay elements 21 is connected to the first input terminal 11. In addition, the output terminal of the first stage of the first delay elements 21 is connected to the input terminal of the next stage of the first delay elements 21. The output terminal of the next stage of the first delay elements 21 is connected to the input terminal of the next, subsequent stage of the first delay elements 21. By configuring in this way, the n-stages of the first delay elements 21 are configured to be connected in series to the first input terminal 11. The first stage of the first delay elements 21 thereby latches the output level (truth value "1" or "0" indicated according to voltage) of the original signal of the Power-good signal upon starting of the first clock signal. In addition, the second and later stages of the first delay elements 21 latch the output level of the previous stage of the first delay element 21 upon rising of the first clock signal.

The clock terminal of the n-stages of the first delay elements 21 are respectively connected to the first clock terminal 13. In other words, the n-stages of the first delay elements 21 operate synchronous to the first clock signal inputted to the first clock terminal 13. In addition, asynchronous reset, terminals of the n-stages of the first delay elements 21 are respectively connected to the output of the second glitch removal unit 30A. In other words, the n-stages of the first delay elements 21 are initialized when the output of the second glitch removal unit 30A becomes the low level.

The first logical circuit 22 outputs the high level so long as the first input terminal 11 or even any one of the outputs of n-stages of first delay elements 21 is the high level (truth value "1"), and outputs the low level, only in the case of the first input element 11 and the outputs of ail first delay elements 21 being the low level (truth value "0"). In other words, the output of the first logical circuit 22 (output of the first glitch removal unit 20A) becomes the high level immediately after the original signal of the Power-good signal becomes the high level, and the original signal of the Power-good signal transitions to the low level, when the level of the original signal of the current and the past n-times (total of n+1 times) of cycles of the first clock signal becomes the low level. Therefore, the first glitch removal unit 20A outputs to the first output terminal the output signal removing no more than n-times consecutive signals of low level from the original signal of the Power-good signal as glitch noise.

The second glitch removal unit 30A has n-stages (n is a positive integer) of second delay elements 31; and a second logical circuit 32 which outputs the logical sum (operation result) of the outputs of each stage of m-stages of second delay elements 31 and the current input signal (current original signal of the Power-on Reset signal).

The m-stages of the second delay elements 31 can respectively be configured by D-flip flops having an input terminal, output terminal, clock terminal and asynchronous reset terminal.

Among the m-stages of the second delay elements 31, the input terminal of the first stage of the second delay elements 31 is connected to the second input terminal 12. In addition, the output terminal of the first stage of the second delay elements 31 is connected to the input terminal of the next stage of the second delay elements 31. The output terminal of the next stage of the second delay elements 31 is connected to the input terminal of the next subsequent stage of the second delay element 31. By configuring in this way, the m-stages of the second delay elements 31 are configured to be connected in series to the second input terminal 12. The first stage of second delay elements 31 thereby latches the value of the original signal of the Power-on Reset signal upon rising of the second clock signal. In addition, the second and later stages of the second delay elements 31 latch the value of the second delay element 31 of the previous stage upon rising of the second clock signal.

The clock terminals of the m-stages of the second delay elements 31 are respectively connected to the second clock terminal 14. In other words, the m-stages of the second delay elements 31 operate synchronously to the second clock signal inputted to the second clock terminal 14. In addition, the asynchronous reset terminals of the m-stages of the second delay elements 31 are respectively connected to the output of the first glitch removal unit 20A. In other words, the m-stages of the second delay elements 31 are initialized when the output of the first glitch removal unit 20A becomes the low level.

The second logical circuit 32 outputs the high level so long as the second input terminal 12 or even any one of the output of the m-stages of second delay elements 31 is the high level, and outputs the low level only in the case of the second input terminal 12 and the outputs of all of the second delay elements 31 being the low level. In other words, the output of the second logical circuit 32 (output of the second glitch removal unit becomes the high level immediately after the original signal of the Power-on Reset signal becomes the high level, and the original signal of the Power-on Reset signal transitions to the low level when the original signals of the current and past m times (total of m+1 times) successively becomes the low level in the cycles of the second clock signal. Therefore, the second glitch removal unit 30A outputs to the second output terminal 16 an output signal produced by removing successive signals of the low level of no more than m times from the original signal of the Power-on Reset signal as glitch noise.

Operation of the glitch removal circuit 1A will be explained in detail. FIGS. 3A to 3H show the signal levels of each part of the glitch removal circuit 1A during normal operation by adding time.

Figure 3A:
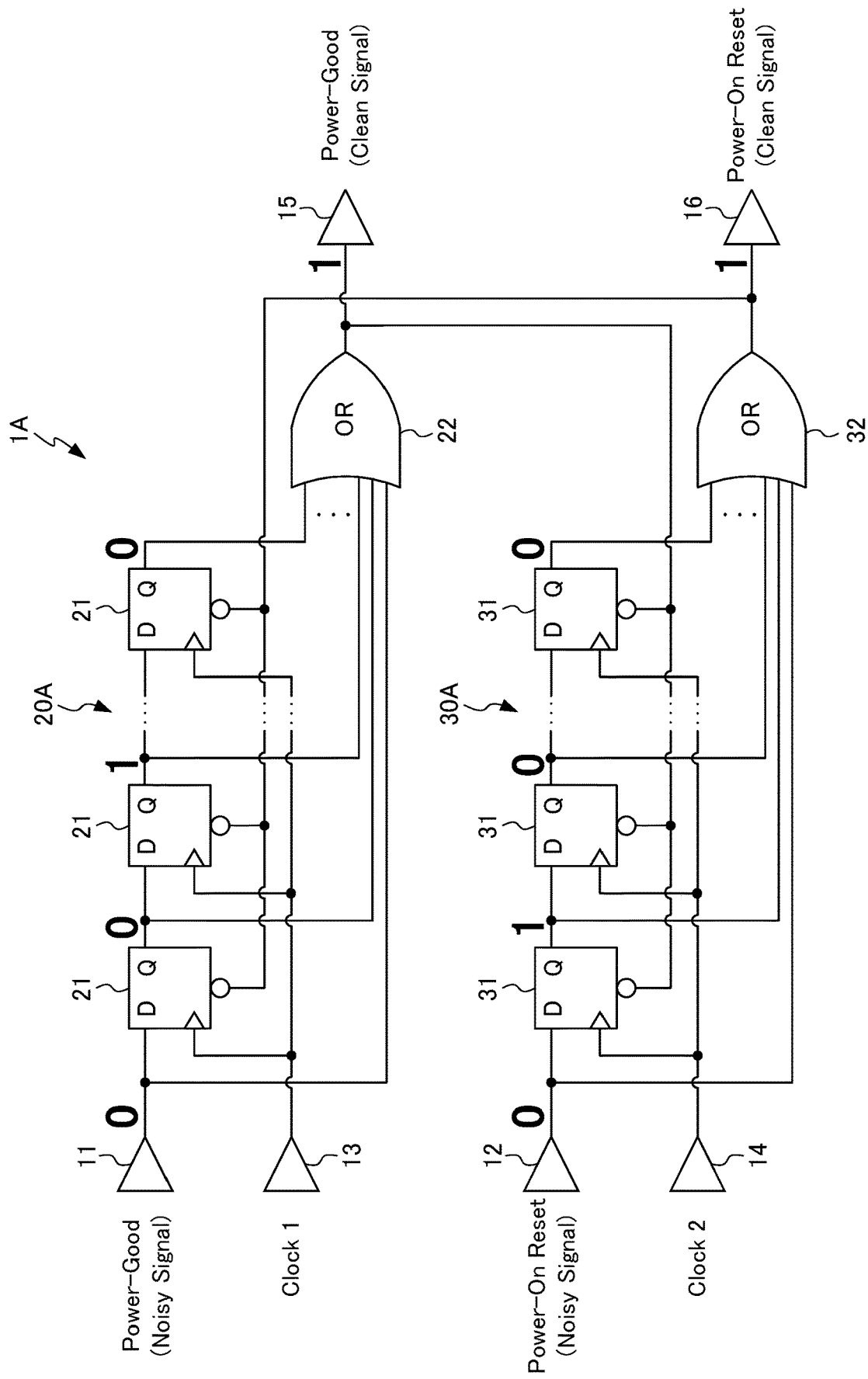
FIG. 3A is a circuit diagram adding signal levels of each part during normal operation in the glitch removal circuit of FIG. 2.

During startup of the glitch removal circuit 1A, i.e. when the power supply voltage rises, or in a state prior to a fixed time elapsing since the power supply voltage rises, the Power-good signal inputted to the first input terminal 11 and the Power-on Reset signal inputted to the second input terminal 12 are the low level (=0). At this time, the signal levels of the first delay element 21 and second delay element 31 also have a possibility of being the high level (=1) and a possibility of being the low level. As shown in FIG. 3A, in the case of the output (retention value) being for high level even in one among the n-stages of first delay elements 21, since the output of the first logical circuit 22 becomes the high level, the output of the first glitch removal unit 20A (output signal outputted from the first output terminal 15) becomes the high level. Similarly, in a case of the output of even one among the m-stages of second delay elements 31 becoming the high level, since the output of the second logical circuit 32 becomes the high level, the output of the second glitch removal unit 30A (output signal outputted from the second output terminal 16) becomes the high level. At this time, the first output terminal 15 and second output terminal 16 are both the high level, and the state of the succeeding circuit is undecided.

Figure 3B:
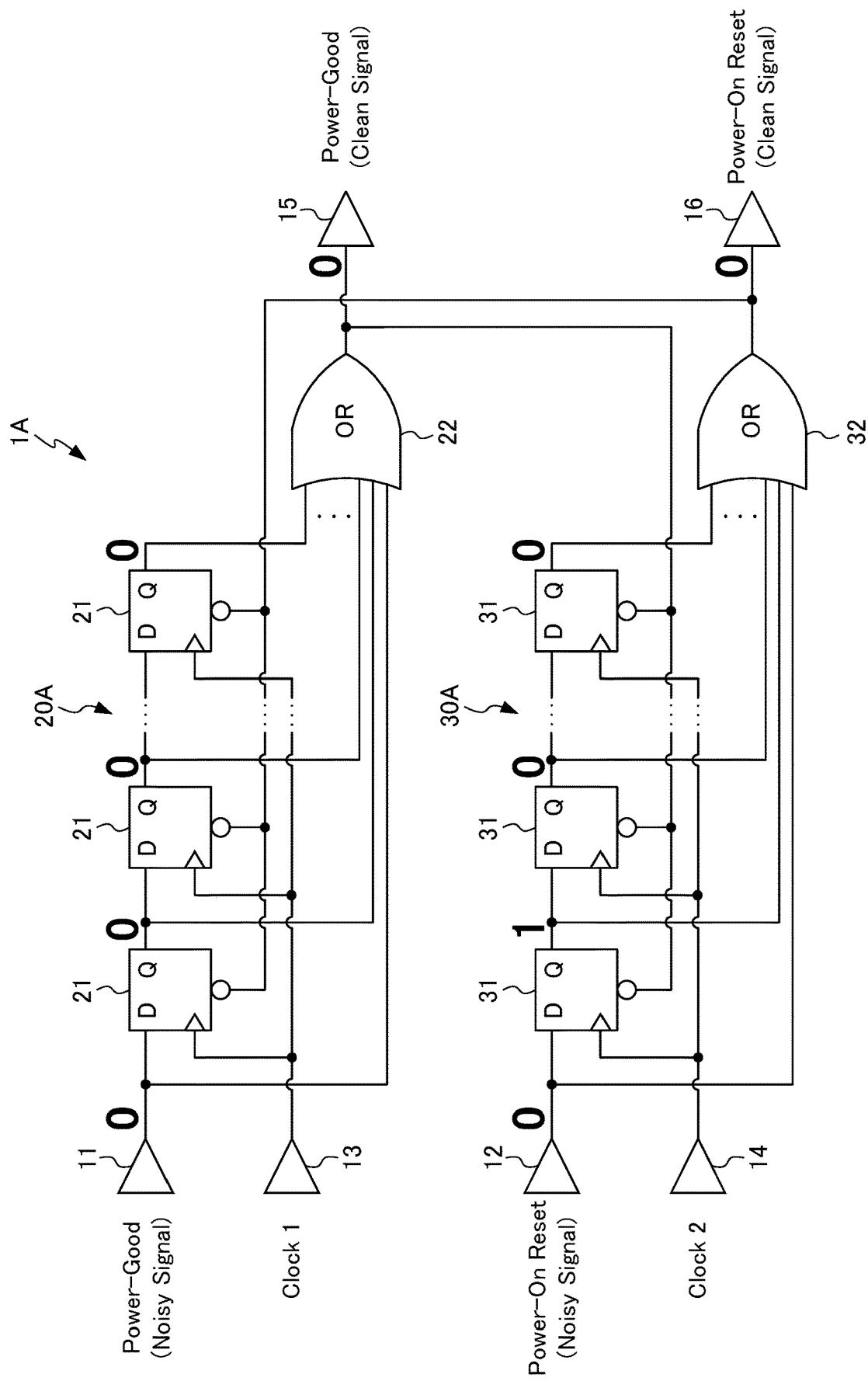
FIG. 3B is a circuit diagram showing signal levels subsequent to FIG. 3A.
Figure 3C:
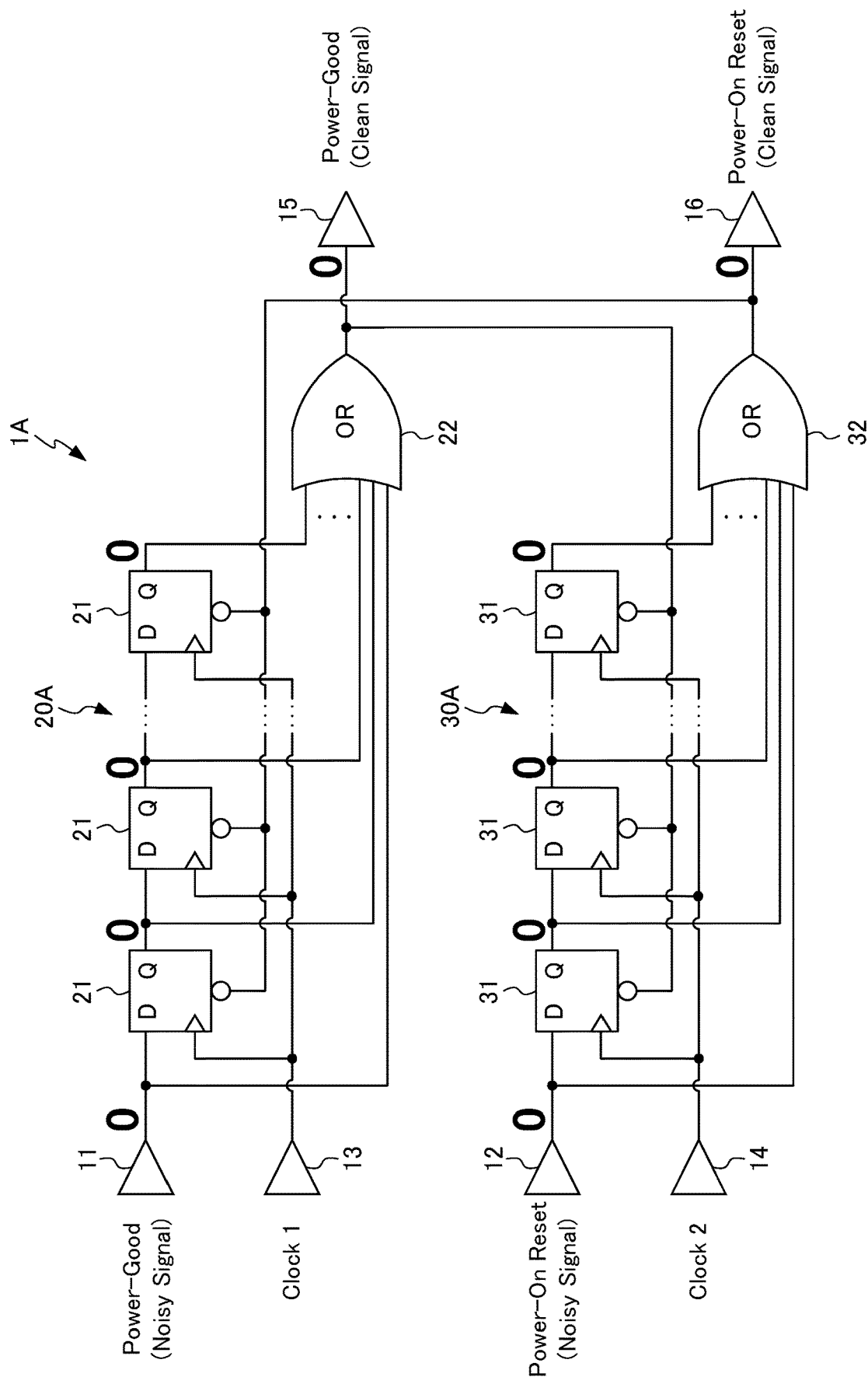
FIG. 3C is a circuit diagram showing signal levels subsequent to FIG. 3B.

From the state of FIG. 3A, when the first clock signal rises n times, the outputs of the n-stages of first delay elements 21 all become the low level, as shown in FIG. 3B. The output of the first glitch removal unit 20A thereby becomes the low level. When this is done, the second glitch removal unit 30A is initialized according to the output of the first glitch removal unit 20A, and the outputs of the m-stages of second delay elements 31 all become the low level. The output of the second glitch removal unit 30A thereby also become the low level, as shown in FIG. 3C. At this time, the first output terminal 15 and second output terminal 16 both become the low level, and the succeeding circuit enters a reset state.

Figure 3E:
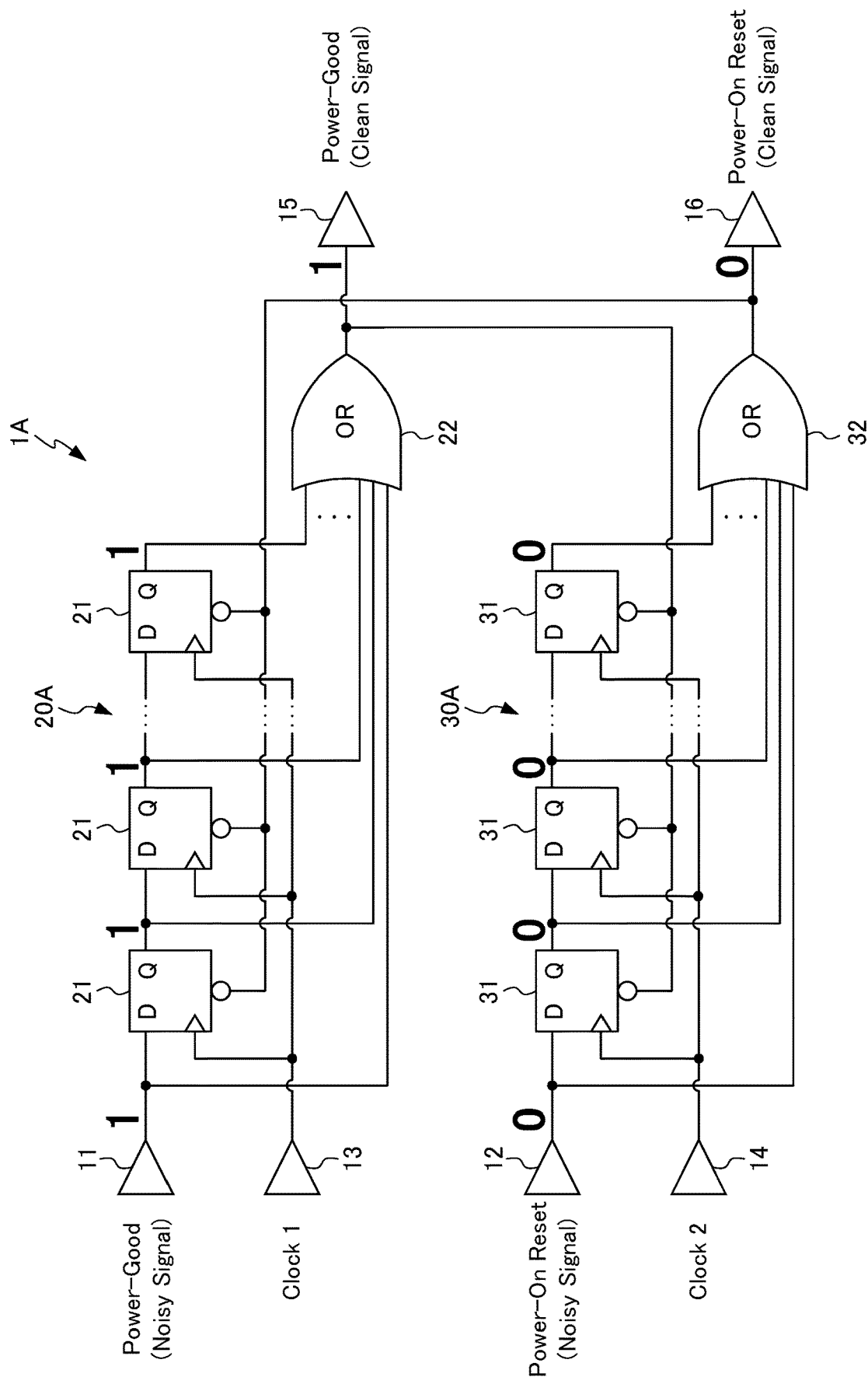
FIG. 3E is a circuit diagram showing signal level subsequent to FIG. 3D.

Subsequently, when the power supply voltage rises, or a fixed time elapses after power supply voltage rise, and the original signal of the Power-good signal inputted to the first input terminal 11 becomes the high level, the output of the first glitch removal unit 20A becomes the high level as shown in FIG. 3D. At this time, the natter of the first output terminal 15 becoming the high level, and the power supply rising is notified to the succeeding circuit. When the Power-good signal becomes the high level, and then the first clock signal rises n times, the outputs of the n-stages of first delay elements 21 all become the high level, as shown in FIG. 3E.

Figure 3F:
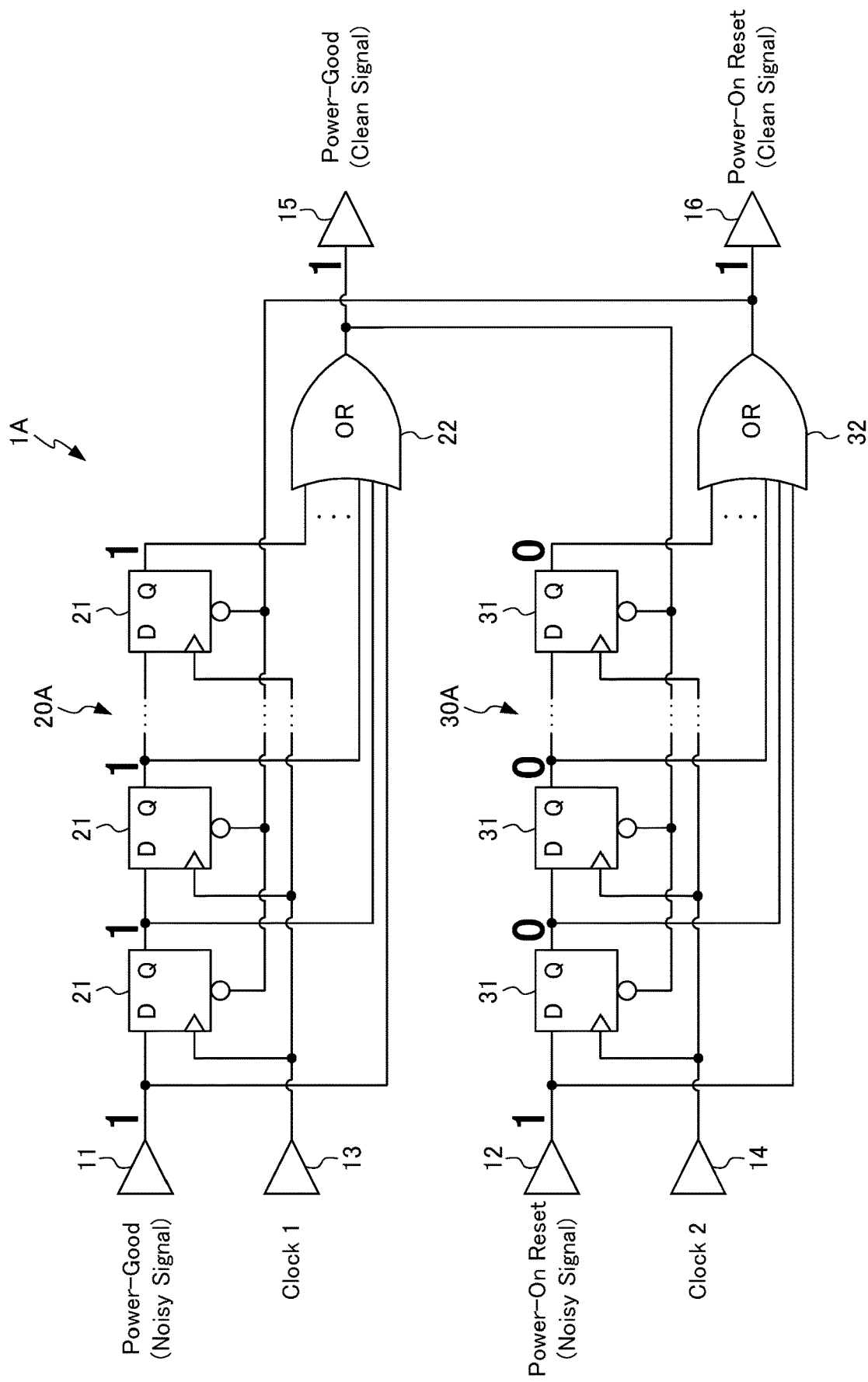
FIG. 3F is a circuit diagram showing signal levels subsequent to FIG. 3E.

Furthermore, when a fixed time elapses, the original signal of the Power-on Reset signal inputted to the second input terminal 12 becomes the high level. The output of the second glitch removal unit 30A thereby becomes the high level, as shown in FIG. 3F. At this time, the second output terminal 16 becomes the high level, and reset of the succeeding circuit is cancelled. When the Power-on Reset signal becomes the high level, and then the second clock signal rises m times, the outputs of the m-stages of second delay elements 31 all become the high level. The output of the second glitch removal unit 30A thereby becomes the high level, as shown in FIG. 3G.

Figure 3H:
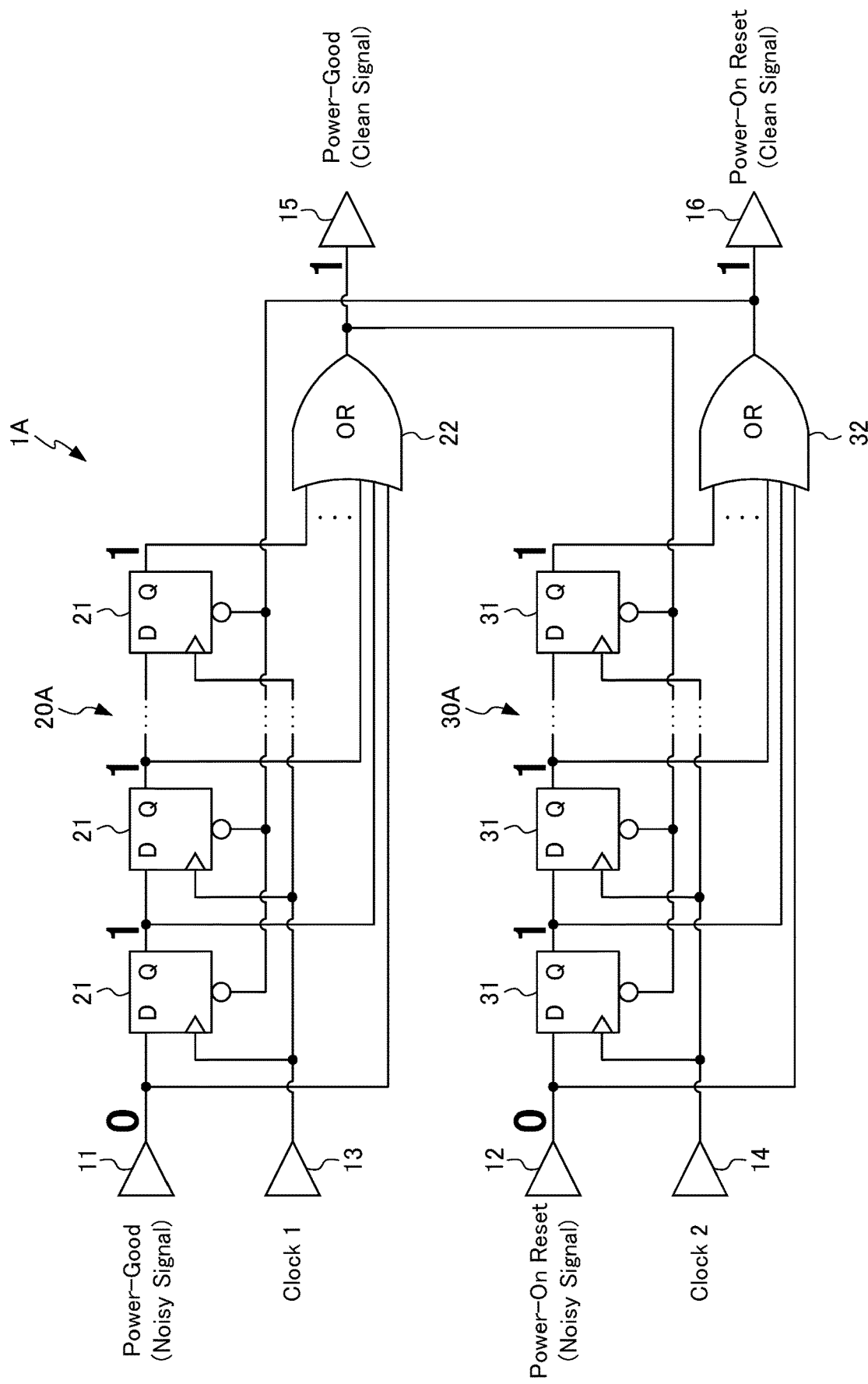
FIG. 3H is a circuit diagram showing signal levels subsequent to FIG. 3G.

As shown in FIG. 3H, even if glitch noise is contained in the original signal of the Power-good signal, and the signal level of the first input terminal 11 temporarily becomes the low level, in the case of any of the n-stages of first delay elements 21 being the high level, the output of the first glitch removal unit 20A is retained at the high level. Similarly, even if glitch noise is contained in the original signal of the Power-on Reset signal, and the signal level of the second input terminal 12 temporarily becomes the low level, in a case of any of the m-stages of second delay element 31 being the high level, the output of the second glitch removal unit 30A is retained at the high level. Therefore, the first output terminal 15 and second output terminal 16 retain the high level even if glitch noise is added to the first input terminal 11 or second input terminal 12, and it is possible to continue operation normally without the succeeding circuit (not shown) being initialized.

Figure 4:
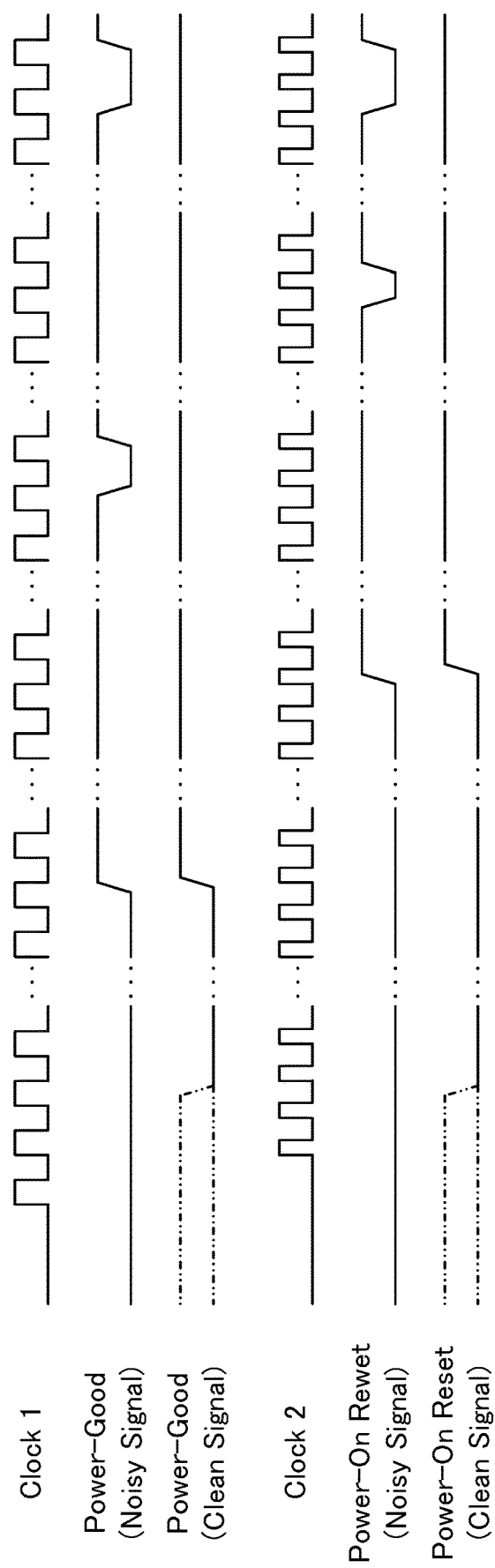
FIG. 4 is a time chart showing the time series of signals during normal operation of the glitch removal circuit in FIG. 2.

FIG. 4 exemplifies a time series of the input signals and output signals of the glitch removal circuit 1A during normal operation. As shown, the glitch removal circuit 1A can output from the second output terminal 16 an output signal (Power-good Clean Signal) produced by removing glitch noise from the original signal of the Power-good signal (Power-good Noisy Signal) from the first output terminal 15; and can output an output signal (Power-on Reset Clean Signal) produced by removing glitch noise from the original signal of the Power-on Reset signal (Power-on Reset Noisy Signal).

Next, a case of the first clock signal stopping, and the signal inputted to the first clock terminal 13 being the low level as is (or case being the high level as is) will be explained. FIGS. 5A to 5H show the signal levels of each part of the glitch removal circuit 1A in a case of the first clock signal stopping, by adding time.

Figure 5A:
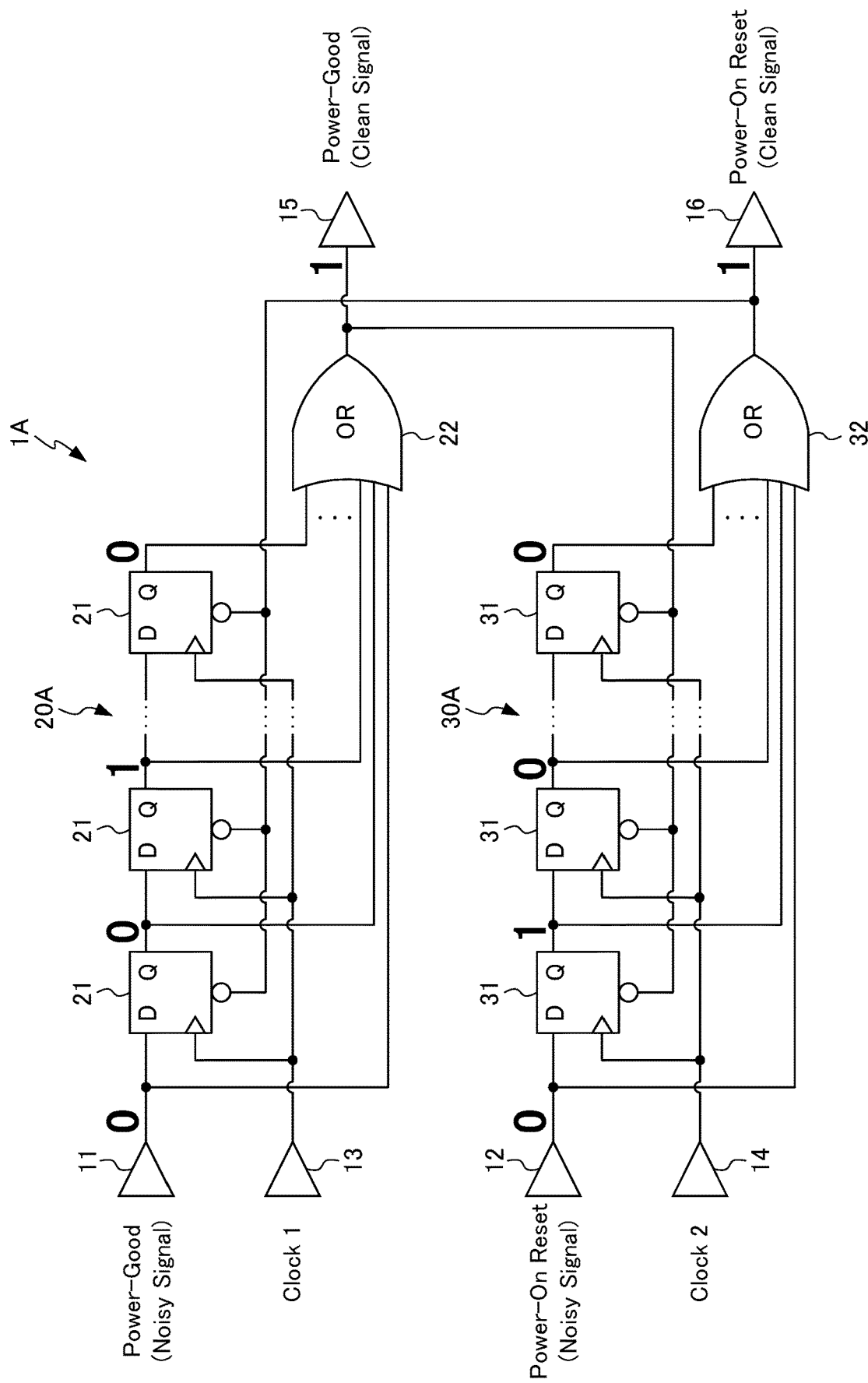
FIG. 5A is a circuit diagram adding signal levels of each part during first clock signal stoppage of the glitch removal circuit in FIG. 2.

During startup of the glitch removal circuit 1A, the signal levels of the first delay element 21 and second delay element 31 are undecided. As shown in FIG. 5A, in a case of the output becoming the high level in even one among the n-stages of first delay element 21, the output of the first glitch removal unit 20A becomes the high level. Similarly, in a case of the output becoming the high level in even one among the m-stages of second delay elements 31, the output of the second glitch removal unit 30A becomes the high level. At this time, the first output terminal 15 and second output terminal 16 are both the high level, and the state of the succeeding circuit is undecided.

Figure 5B:
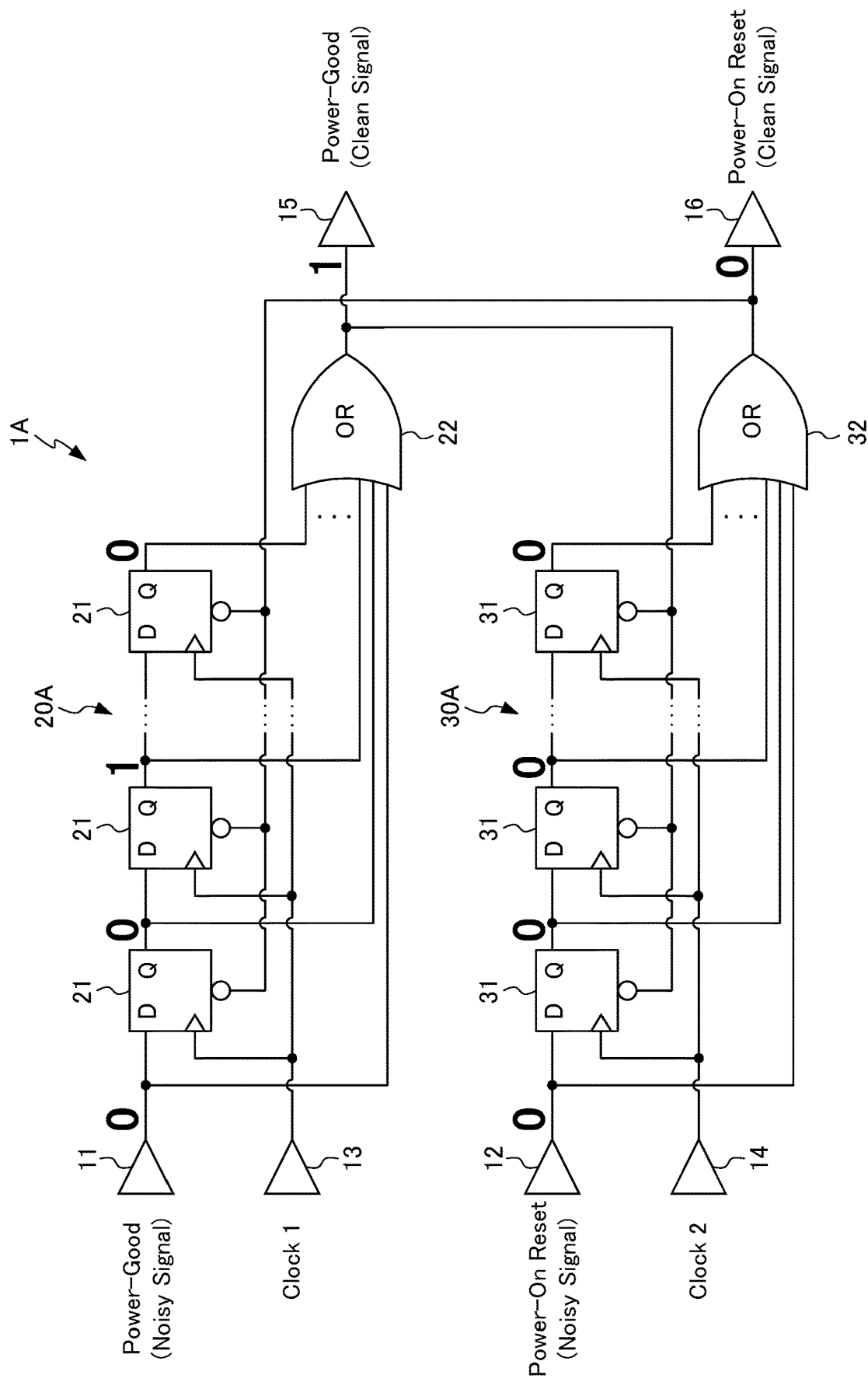
FIG. 5B is a circuit diagram showing signal levels subsequent to FIG. 5A.
Figure 5C:
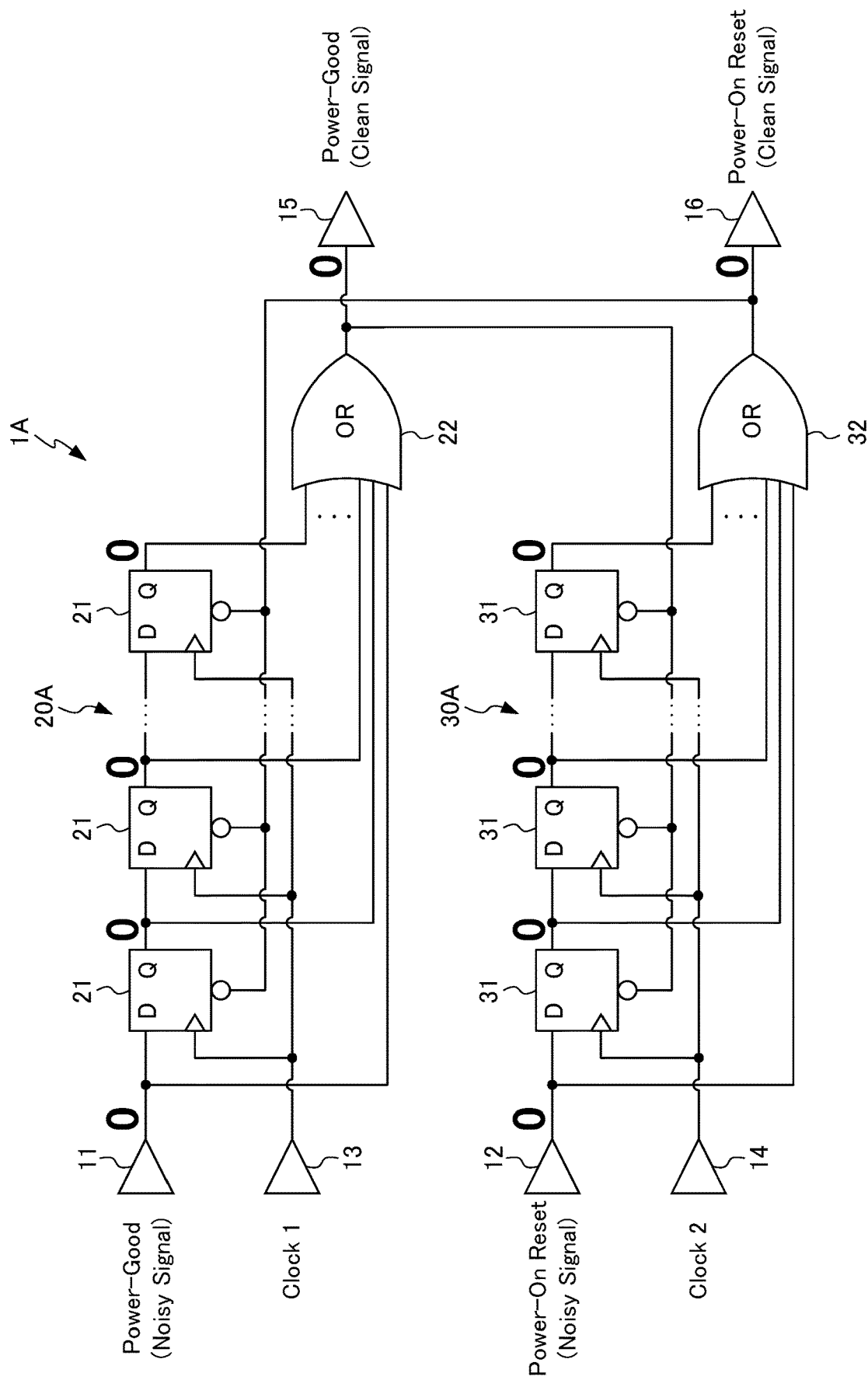
FIG. 5C is a circuit diagram showing signal levels subsequent to FIG. 5B.

From the state of FIG. 5A, when the second clock signal rises m times, the outputs of the m-stages of second delay elements 31 all become the low level. As shown in FIG. 5B, the output of the second glitch removal unit 30A thereby becomes the low level. When this is done, the first glitch removal unit 20A is thereby initialized according to the output of the second glitch removal unit 30A, and the outputs of the n-stages of the first delay elements 21 all become the low level. As shown in FIG. 5C, the output of the first glitch removal unit 20A thereby also becomes the low level, as shown in FIG. 5C. At this time, the first output terminal 15 and second output terminal 16 both become the low level, and the succeeding circuit enters the reset state.

Figure 5D:
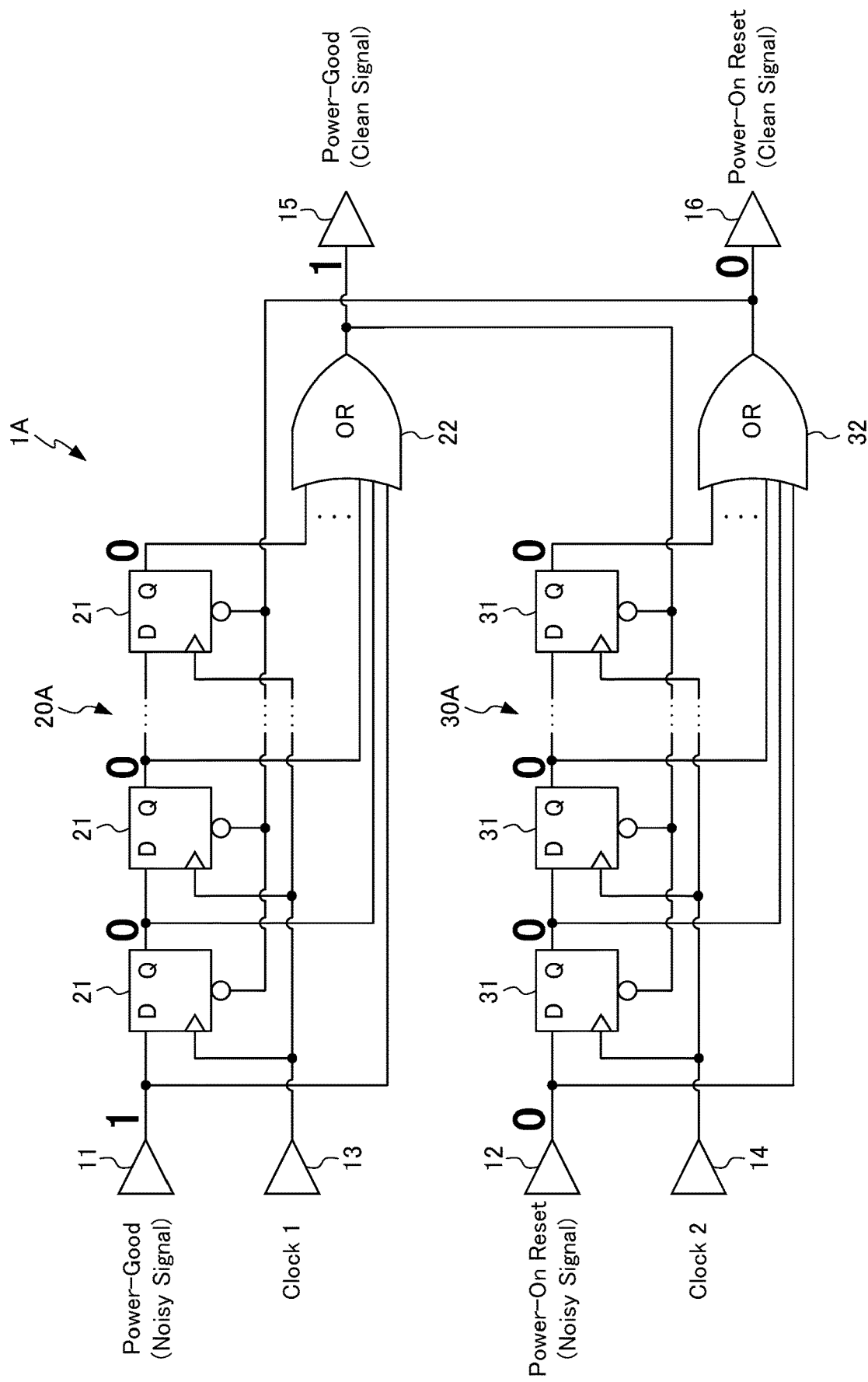
FIG. 5D is a circuit diagram showing signal levels subsequent to FIG. 5C.
Figure 5E:
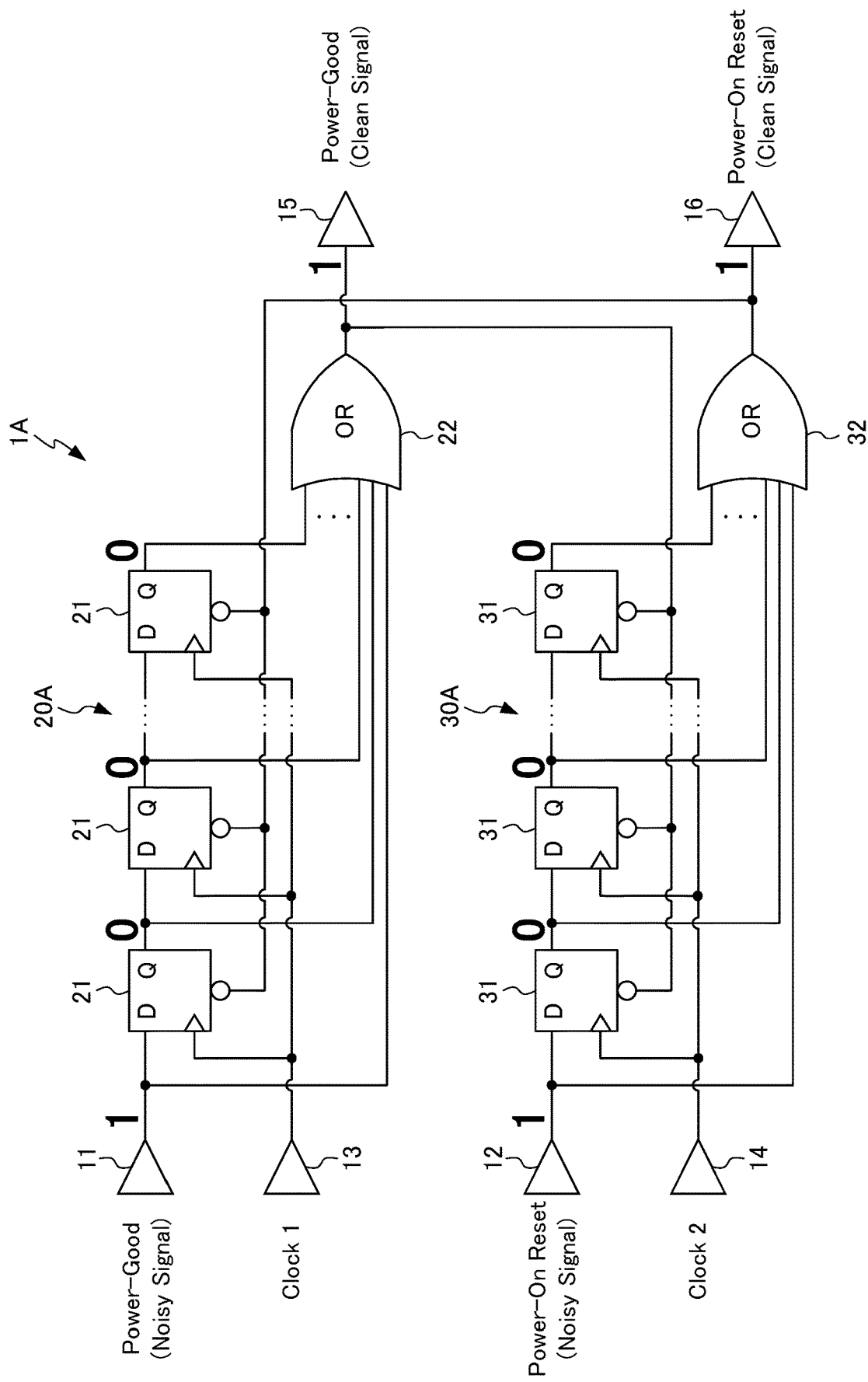
FIG. 5E is a circuit diagram showing signal levels subsequent to FIG. 5D.
Figure 5F:
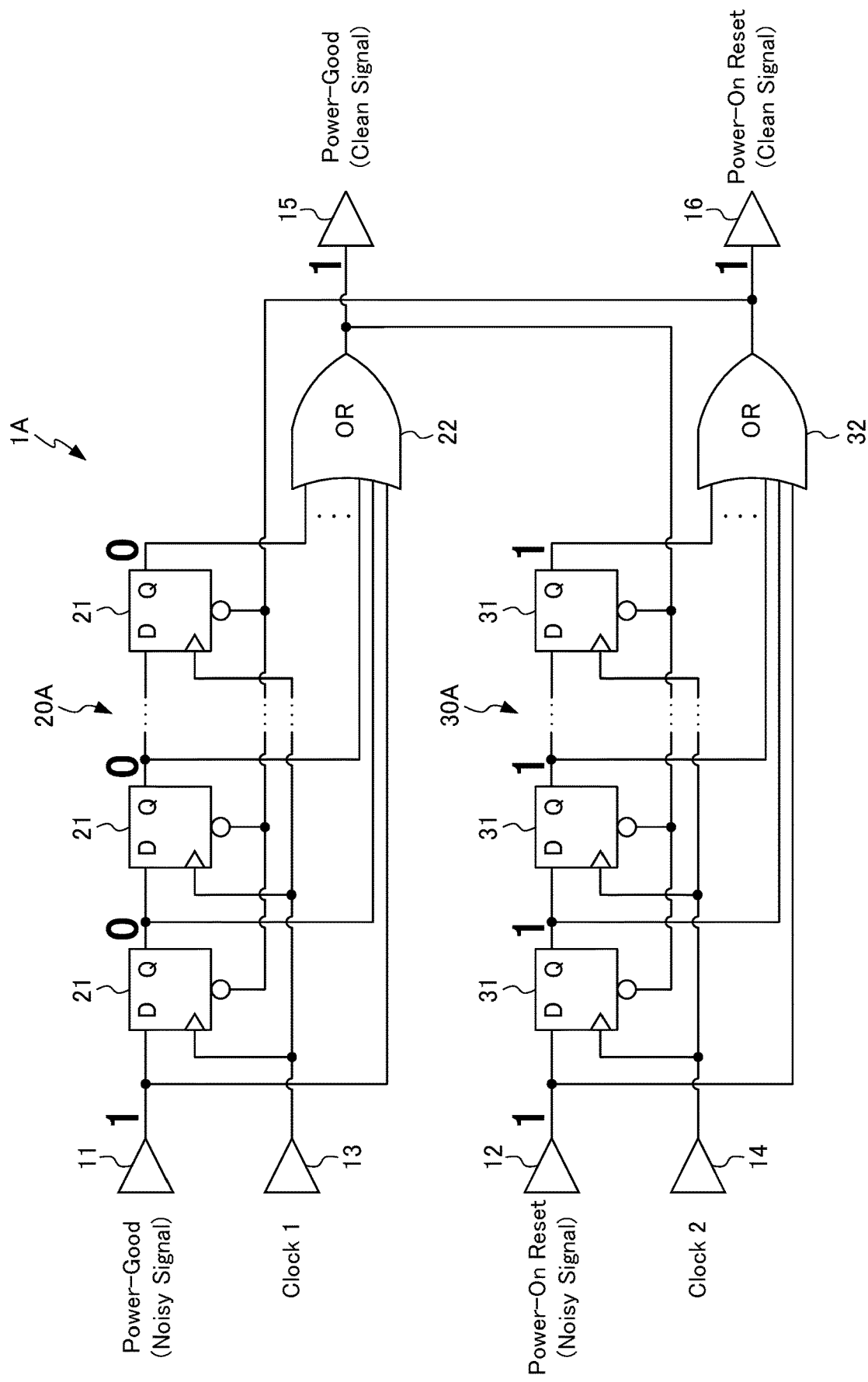
FIG. 5F is a circuit diagram showing signal levels subsequent to FIG. 5E.

Subsequently, when the original signal of the Power-good signal becomes the high level, the output of the first glitch removal unit 20A becomes the high level, as shown in FIG. 5D. At this time, the first output terminal 15 becomes the high level, and the matter of the power supply starting is notified to the succeeding circuit. Furthermore, when a fixed time elapses, the original signal of the Power-on Reset signal inputted to the second input terminal 12 becomes the high level. When the Power-on Reset signal becomes the high level, and then the second clock signal rises m-times, the outputs of the m-stages of the second delay elements 31 all become the high level, and the output of the second glitch removal unit 30A becomes the high level. At this time, the second output element 16 becomes the high level, and reset of the succeeding circuit is cancelled. On the other hand, the outputs of the n-stages of the first delay elements 21 are all the low level as is, since the first clock signal is not inputted. For this reason, the output of the first glitch removal unit 20A becomes the same value as the original signal of the Power-good signal.

As shown in FIG. 5G, even if glitch noise is contained in the original signal of the Power-on Reset signal, and the signal level of the second input terminal 12 temporarily becomes the low level, in the case of any of the m-stages of the second delay elements 31 being the high level, the output of the second glitch removal unit 30A is retained at the high level.

Figure 5H:
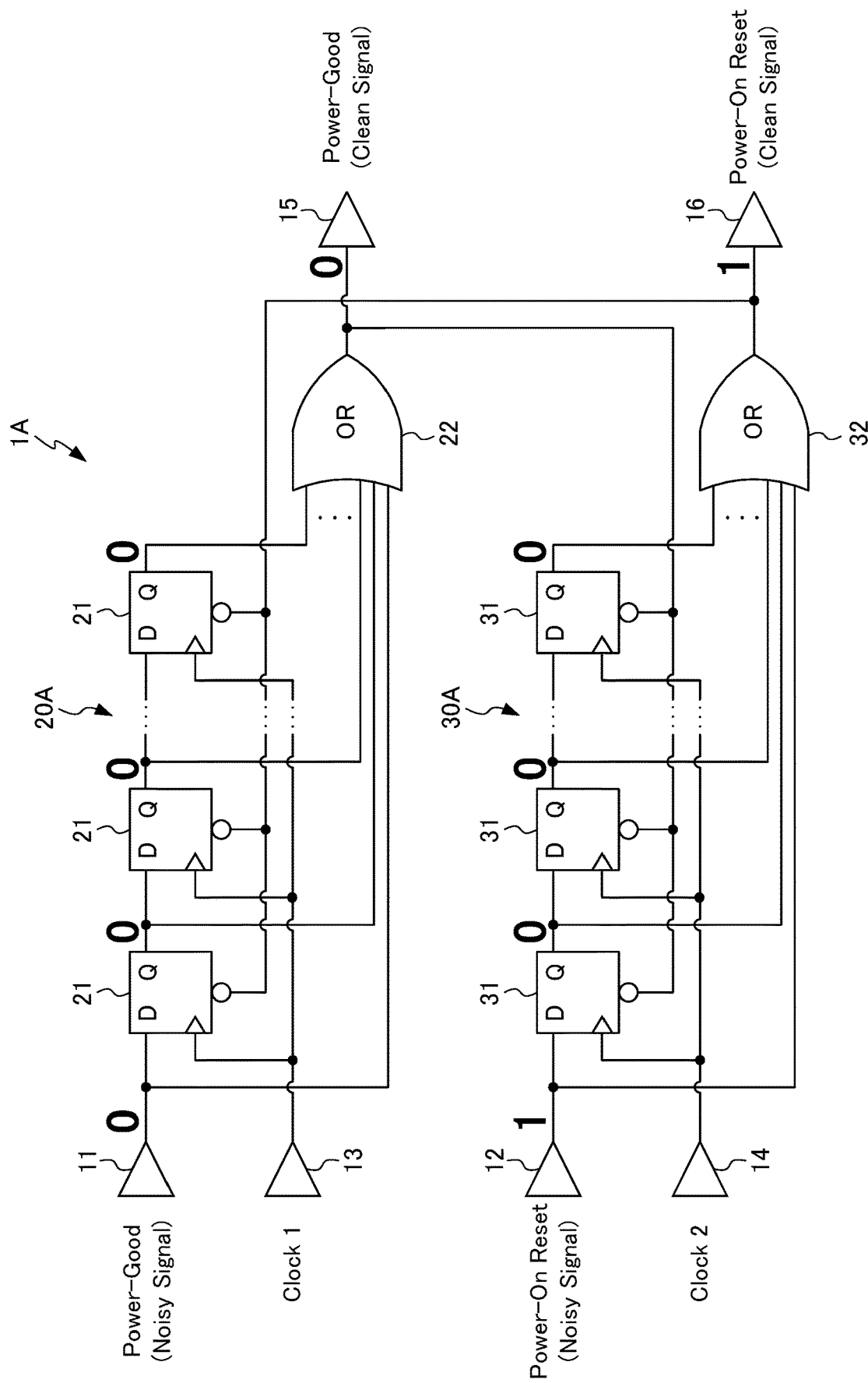
FIG. 5H is a circuit diagram showing signal levels subsequent to FIG. 5G.

In the case of glitch noise being contained in the original signal of the Power-good signal, and the signal level of the first input terminal 11 temporarily becoming the low level, the output of the first glitch removal unit 20A becomes the low level. As shown in FIG. 5H, the m-stages of the second delay elements 31 are thereby initialized, and the output of the second glitch removal unit 30A becomes equal to the value of the original signal of the Power-on Reset signal inputted to the second input terminal 12. As shown in FIG. 5H, there is no problem so long as the original signal of the Power-on Reset signal is the high level when the m-stages of the second delay elements 31 were initialized; however, if glitch noise is contained at the same timing in the original signal of the Power-on Reset signal, the output of the second glitch removal unit 30A becomes the low level, and the output of the second glitch removal unit 30A becomes the low level. At this time, the second output terminal 16 becomes the low level, and the succeeding circuit is reset. In other words, there is a possibility of the glitch removal circuit 1A not being able to remove glitch noise from the original signal of the Power-on Reset signal, if the original signal of the Power-good signal and the original signal of the Power-on Reset signal contain glitch noise at the same timing, in the case of the first clock signal being stopped.

Figure 6:
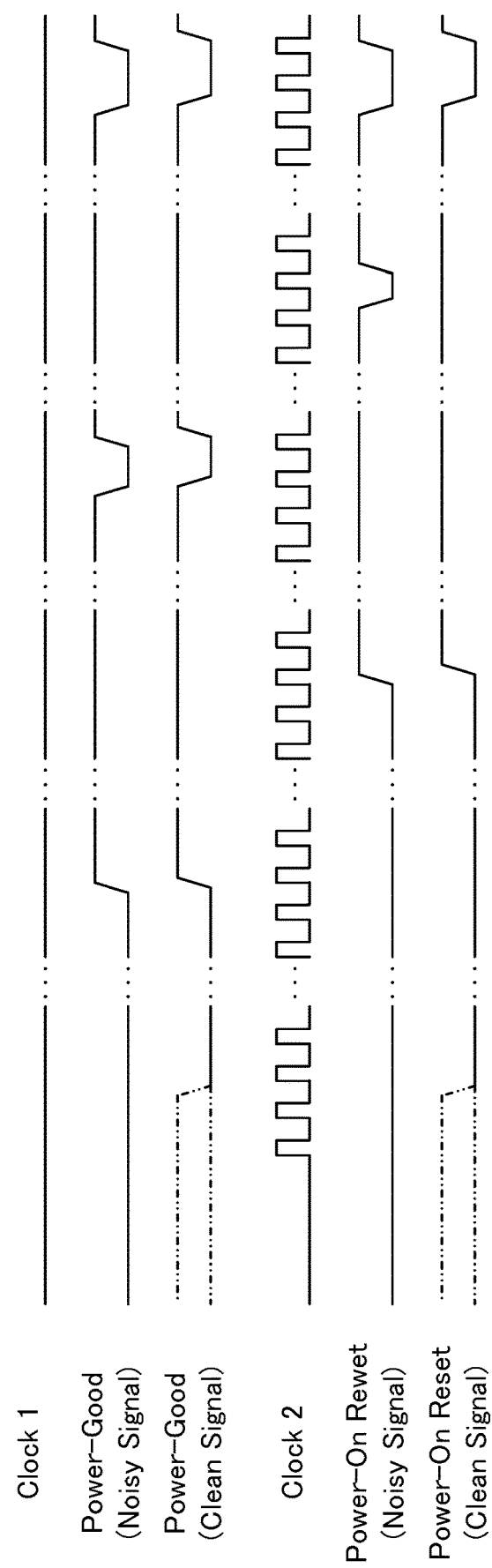
FIG. 6 is a time chart showing a time series during first clock signal stoppage of the glitch removal circuit in FIG. 2.

FIG. 6 exemplifies the time series of the input signal and output signal of the glitch removal circuit 1A during first clock signal stoppage. As illustrated, if the first clock signal stops, the glitch removal circuit 1A cannot remove glitch noise from the original signal of the Power-good signal, and can output the output signal produced by removing glitch noise from the original signal of the Power-on Reset signal, while the original signal of the Power-good signal is the high level.

Furthermore, a case of the first clock signal being inputted, but the second clock signal stopping and the signal inputted to the second clock terminal 14 being the low level as is will be explained. FIGS. 7A to 7H show the signal levels of each part of the glitch removal circuit 1A in a case of the first clock signal stopping by adding time.

During startup of the glitch removal circuit 1A, the signal levels of the first delay element 21 and second delay element 31 are undecided. As shown in FIG. 7A, in the case of the output becoming the high level in even one among the n-stages of the first delay elements 21, the output of the first glitch removal unit 20A becomes the high level. Similarly, in a case of even one among the m-stages of the second delay elements 31 becoming the high level, the output of the second glitch removal unit 30A becomes the high level. At this time, the first output terminal 15 and second output terminal 16 are both the high level, and the state of the succeeding circuit is undecided.

Figure 7B:
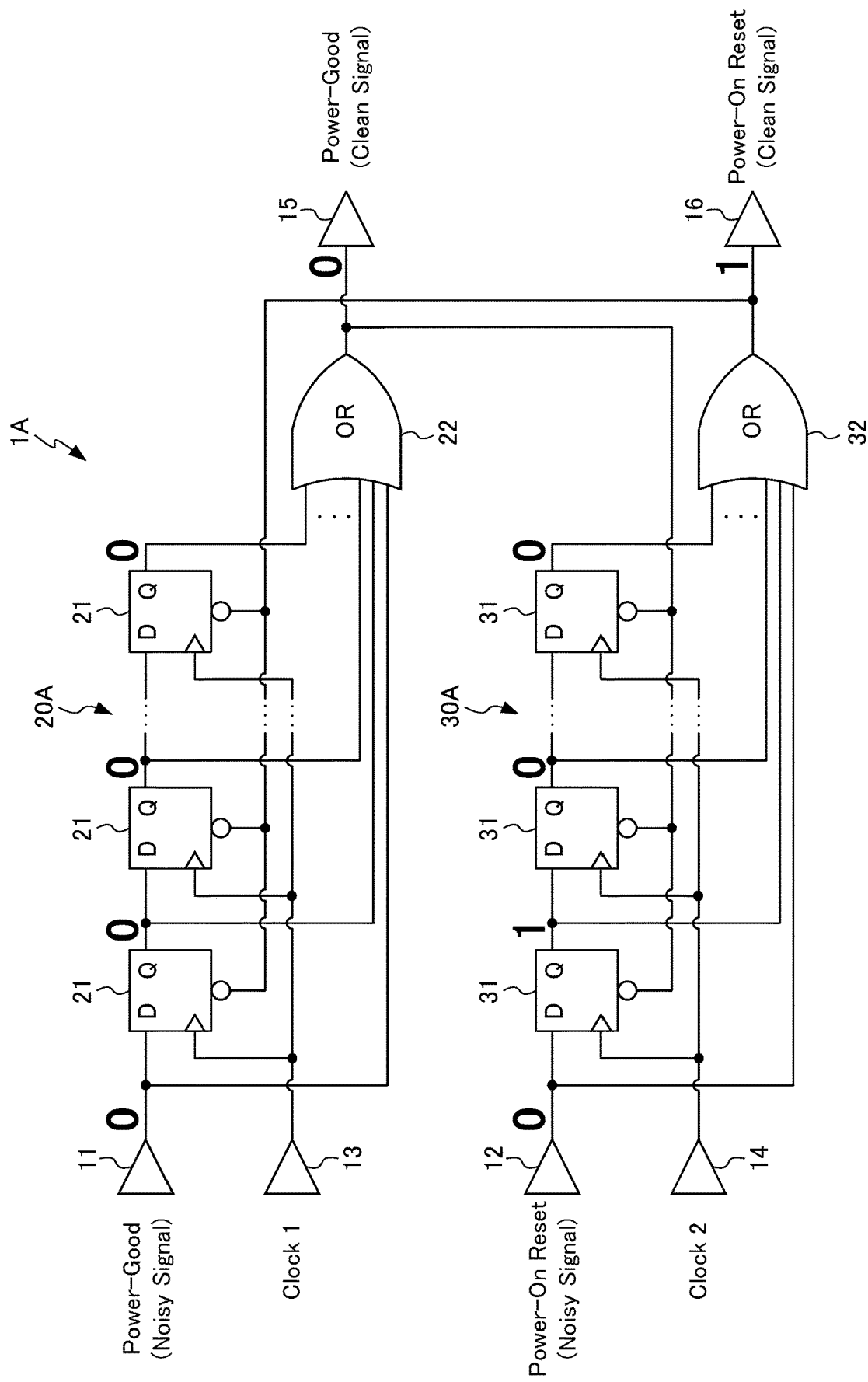
FIG. 7B is a circuit diagram showing signal levels subsequent to FIG. 7A.
Figure 7C:
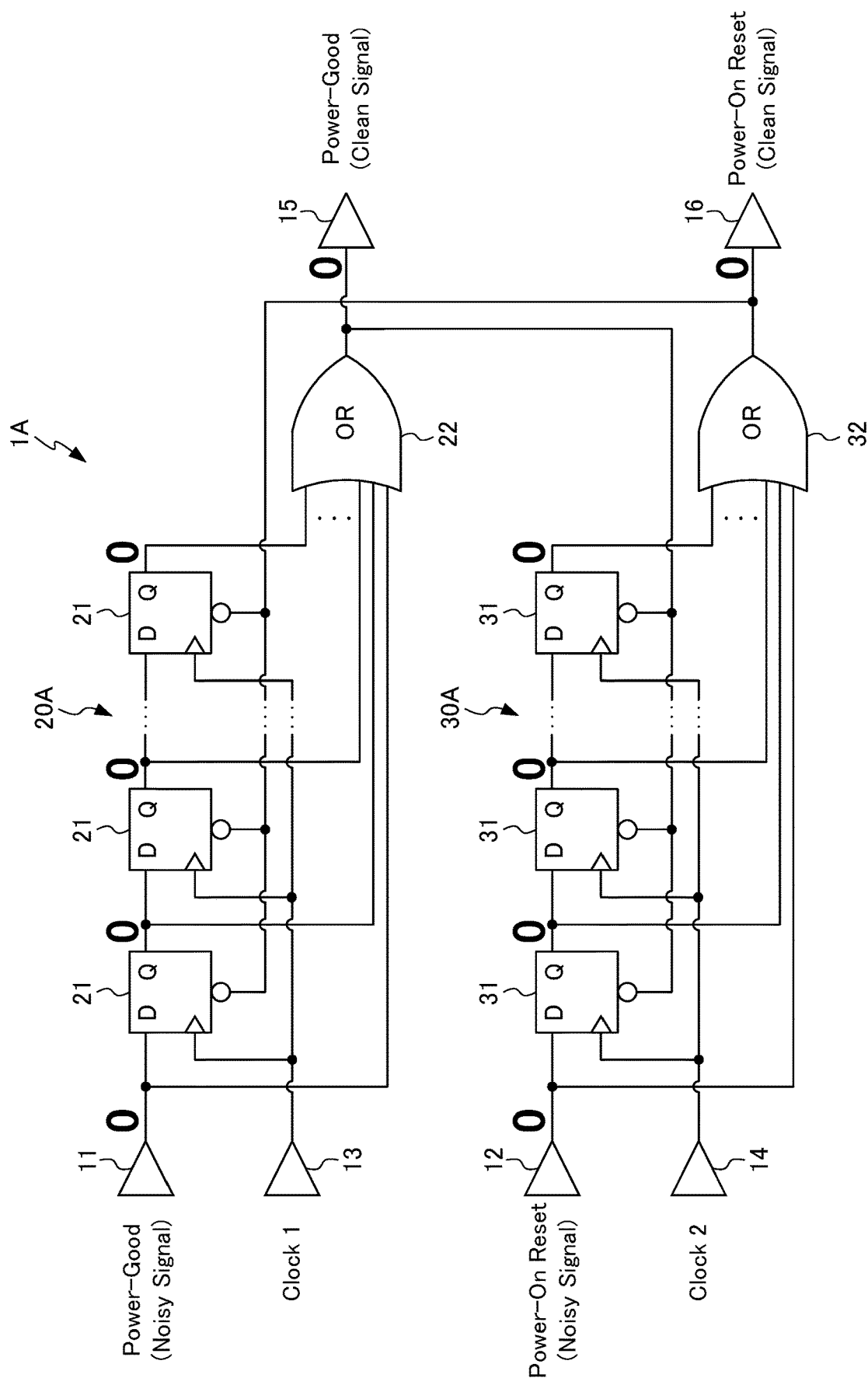
FIG. 7C is a circuit diagram showing signal levels subsequent to FIG. 7B.

From the state of FIG. 7A, when the first clock signal rises n times, the outputs of the n-stages of the first delay elements 21 all become the low level, as shown in FIG. 7B. The output of the first glitch removal unit 20A thereby becomes the low level. When this is done, the second glitch removal unit 30A is initialized according to the output of the first glitch removal unit 20A, and the outputs of the m-stages of the second delay elements 31 all become the low level. As shown in FIG. 7C, the output of the second glitch removal unit 30A thereby becomes the low level. At this time, the first output terminal 15 and second output terminal 16 both become the low level, and the succeeding circuit enters the reset state.

Figure 7D:
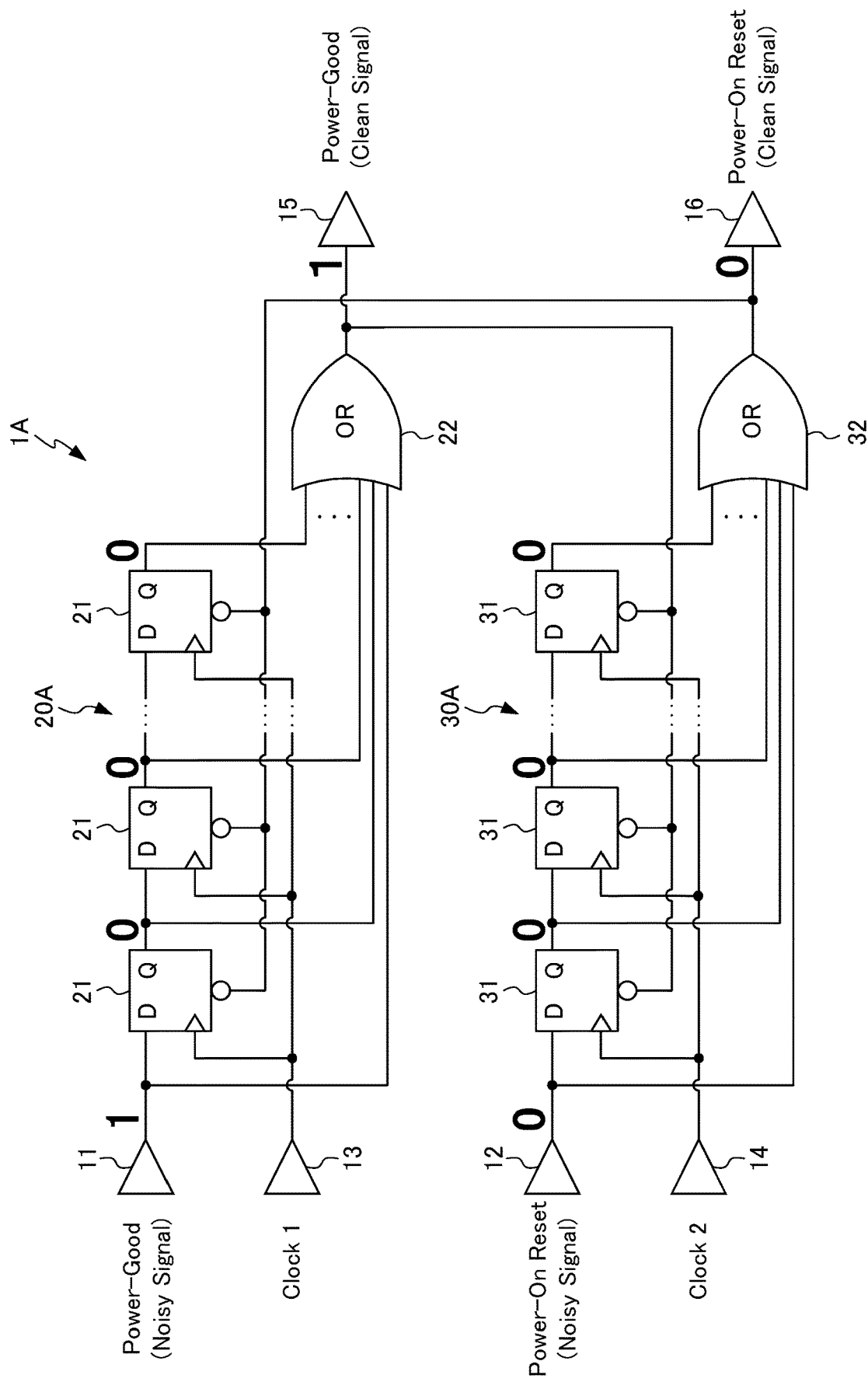
FIG. 7D is a circuit diagram showing signal levels subsequent to FIG. 7C.

Subsequently, when the power supply voltage rises, and the original signal of the Power-good signal inputted to the first input terminal 11 becomes the high level, the output of the first glitch removal unit 20A becomes the high level as shown in FIG. 7D. At this time, the first output terminal 15 becomes the high level, and the event of the power supply starting up is notified to the succeeding circuit. When the Power-good signal becomes the high level, and then the first clock signal rises n times, the output of the n-stages of the first delay element 21 all become the high level as shown in FIG. 7E.

Figure 7F:
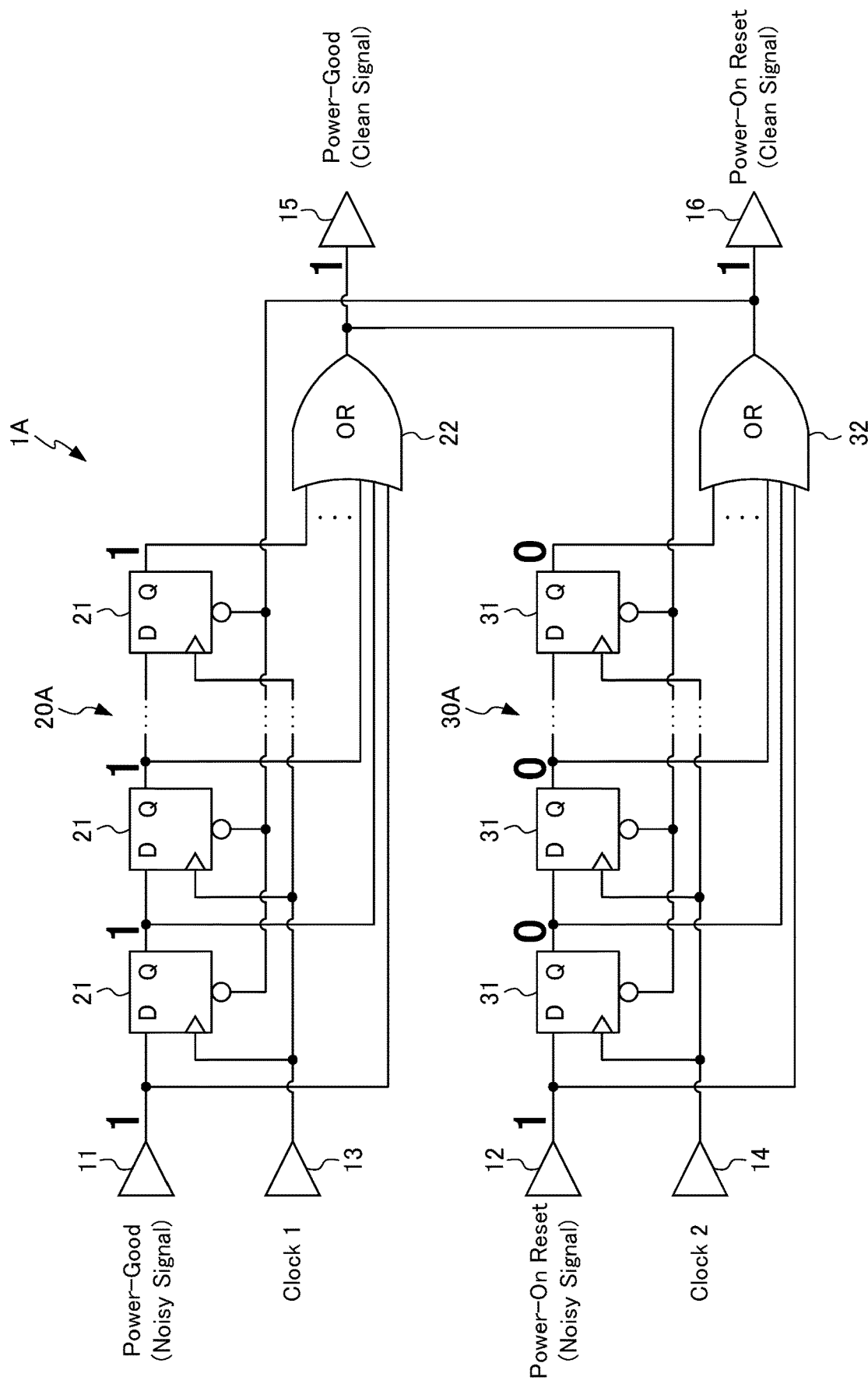
FIG. 7F is a circuit diagram showing signal levels subsequent to FIG. 7E.

On the other hand, since the second clock is not being inputted, the outputs of ail of the second delay elements 31 are retained at the low level as is, as shown in FIG. 7F. For this reason, the output of the second glitch removal unit 30A becomes a value equal to the original signal of the Power-on Reset signal. Furthermore, when a fixed time elapses, the original signal of the Power-on Reset signal inputted to the first input terminal 12 becomes the high level. At this time, the output of the second glitch removal unit 30A becomes the high level, and the second output terminal 16 becomes the high level, whereby reset of the succeeding circuit is cancelled.

Even if glitch noise is contained in the original signal of the Power-good signal, and the signal level of the first input terminal 11 becomes the low level temporarily, in the case of any of the n-stages of the first delay elements 21 being the high level, the output of the first glitch removal unit 20A is retained at the high level as shown in FIG. 7H. On the other hand, in the case of glitch noise being contained in the original signal of the Power-on Reset signal, and the signal level of the second input terminal 12 becoming the low level temporarily, since m-stages of the second delay elements 31 are the low level, the output of the second glitch removal unit 30A will become the low level. At this time, the second output terminal 16 becomes the low level, and the succeeding circuit is reset.

Figure 8:
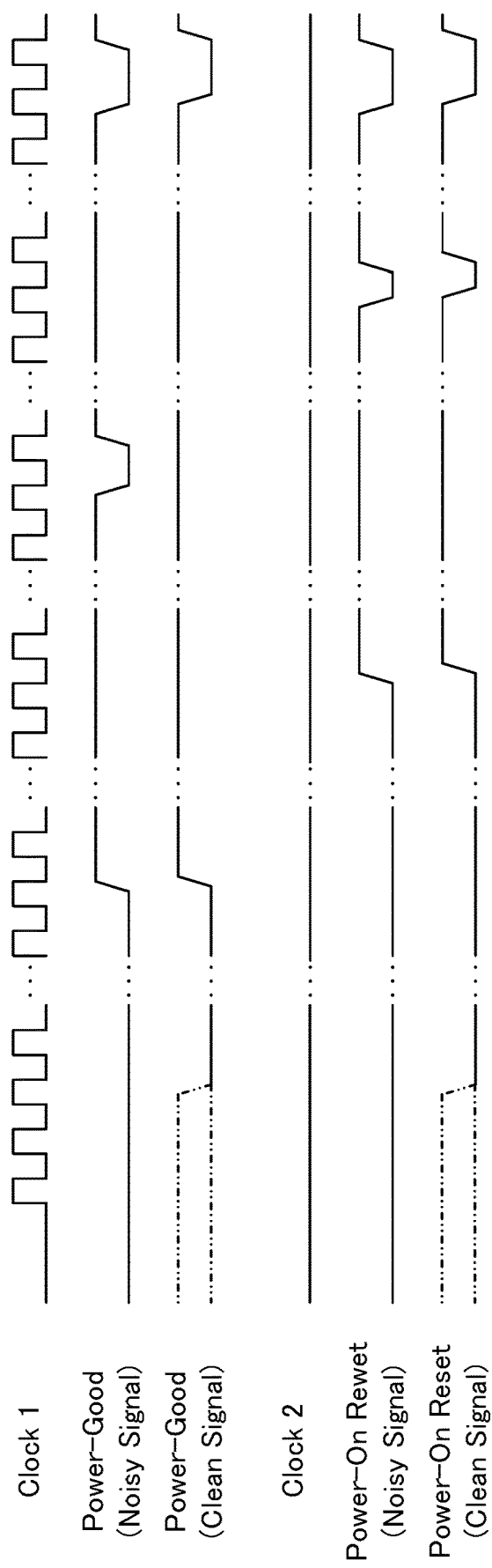
FIG. 8 is a time chart showing a time series during second clock signal stoppage of the glitch removal circuit in FIG. 2.

FIG. 8 exemplifies the time series of the input signals and output signals of the glitch removal circuit 1A during second clock signal stoppage. As illustrated, when the second clock signal stops, the glitch removal circuit 1A cannot remove glitch noise from the original signal of the Power-on Reset signal. In addition, during second clock signal stoppage, in the case of the original signal of the Power-good signal and the original signal of the Power-on Reset signal containing glitch noise simultaneously, there is concern over the glitch removal circuit 1A not being able to output an output signal prepared by removing glitch noise from the original signal of the Power-good signal.

Figure 9:
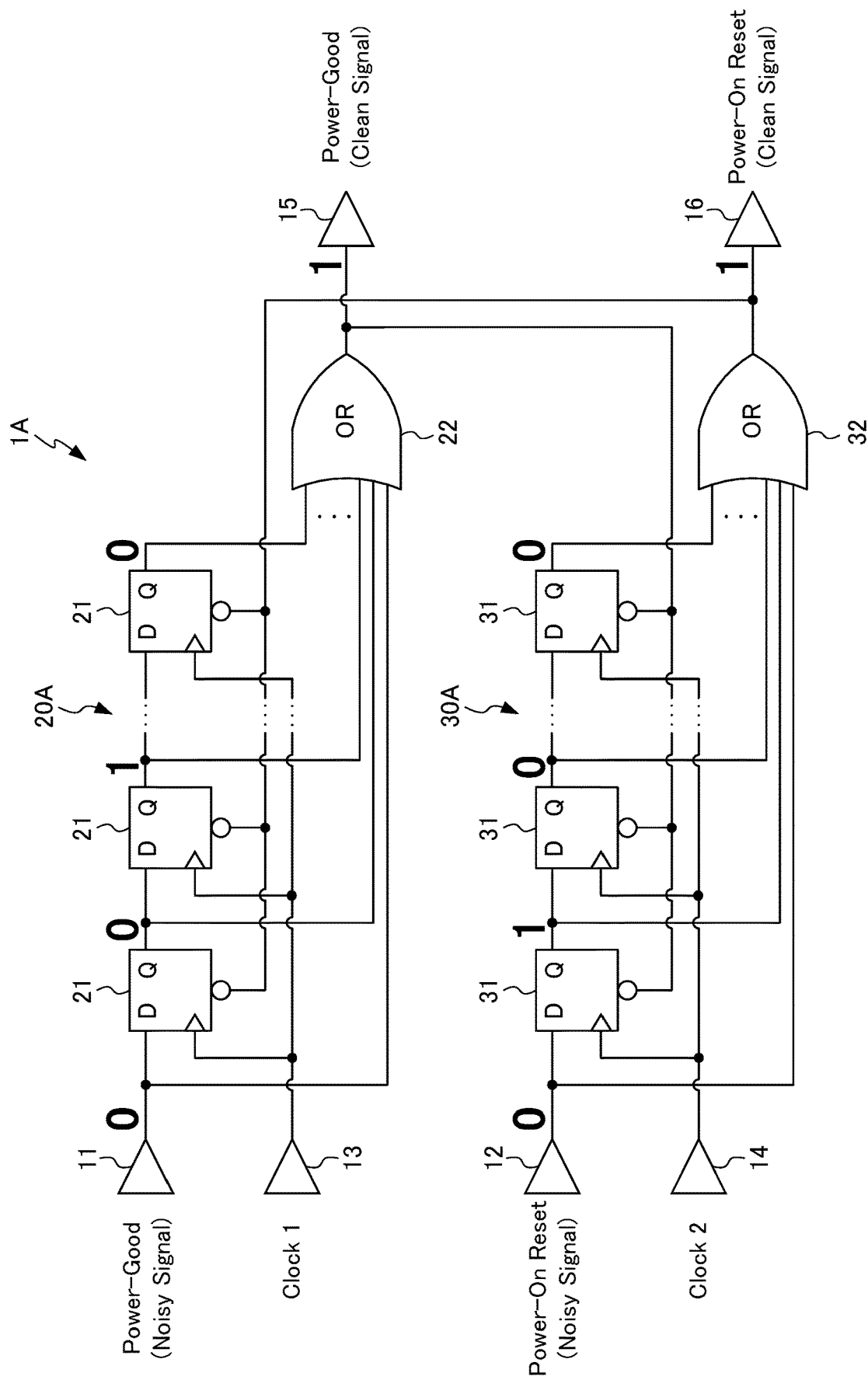
FIG. 9 is a circuit diagram adding signal levels of each part during first clock signal and second clock signal stoppage of the glitch removal circuit in FIG. 2.

Next, a case of the first clock signal and the second clock signal both stopping will be explained. FIG. 9 shows the signal levels of each part of the glitch removal circuit 1A in a case of the first clock signal and second clock signal stopping.

In the case of the first clock signal and second clock signal both stopping, the outputs of the n-stages of the first delay elements 21 and the outputs of the m-stages of the second delay elements 31 will not change from the values during startup. In other words, in the case of the first clock signal and second clock signal both stopping, the retention values of the n-stages of the first delay elements 21 and the m-stages of the second delay elements 31 are all undecided. For this reason, in the glitch removal circuit 1A, as shown in FIG. 9, so long as becoming the high level in even one of any of the n-stages of the first delay elements 21 during startup, the output of the first output terminal 15 always becomes the high level. In addition, in the glitch removal circuit 1A, so long as becoming the high level in even one of any of the m-stages of second delay elements 31 during startup, the output of the second output terminal 16 always becomes the high level. In this case, the state of the succeeding circuit remains undecided.

In addition, in the glitch removal circuit 1A, so long all of the n-stages of first delay elements 21 are the low level during startup, the value of the output signal of the first output terminal 15 will be the same value as the original signal of the Power-good signal. In addition, in the glitch removal circuit 1A, so long as all of the m-stages of second delay elements 31 become the low level during startup, the value of the output signal of the second output terminal 1 will be the same value of the original signal of the Power-on Reset signal. In this case, upon the succeeding circuit entering the reset state normally, reset is cancelled.

Figure 10:
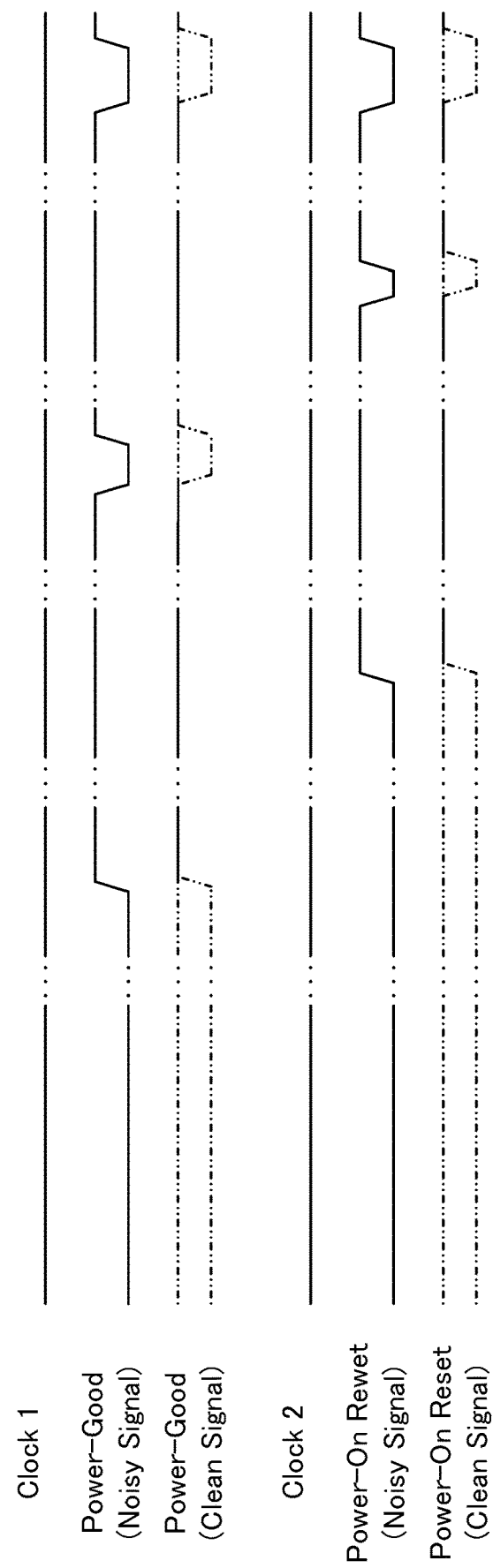
FIG. 10 is a circuit diagram adding signal levels of each part during first, clock signal and second clock signal stoppage of the glitch removal circuit in FIG. 2.

FIG. 10 illustrates the time series of the input signals and output signals of the glitch removal circuit 1A during second clock signal stoppage. As illustrated, there is concern over not only the glitch removal circuit 1A not being able to remove glitch noise of either of the original signal of the Power-good signal and the original signal of the Power-on Reset signal, but also the output signal always being the high level irrespective of the value of the original signal. In this way, the glitch removal circuit 1A will completely lose function if the first clock signal and second clock signal stop simultaneously. For this reason, the first clock signal inputted to the first clock terminal 13 and the second clock signal inputted to the second clock terminal 14 are preferably signals generated by different clock generation sources.

Figure 11:
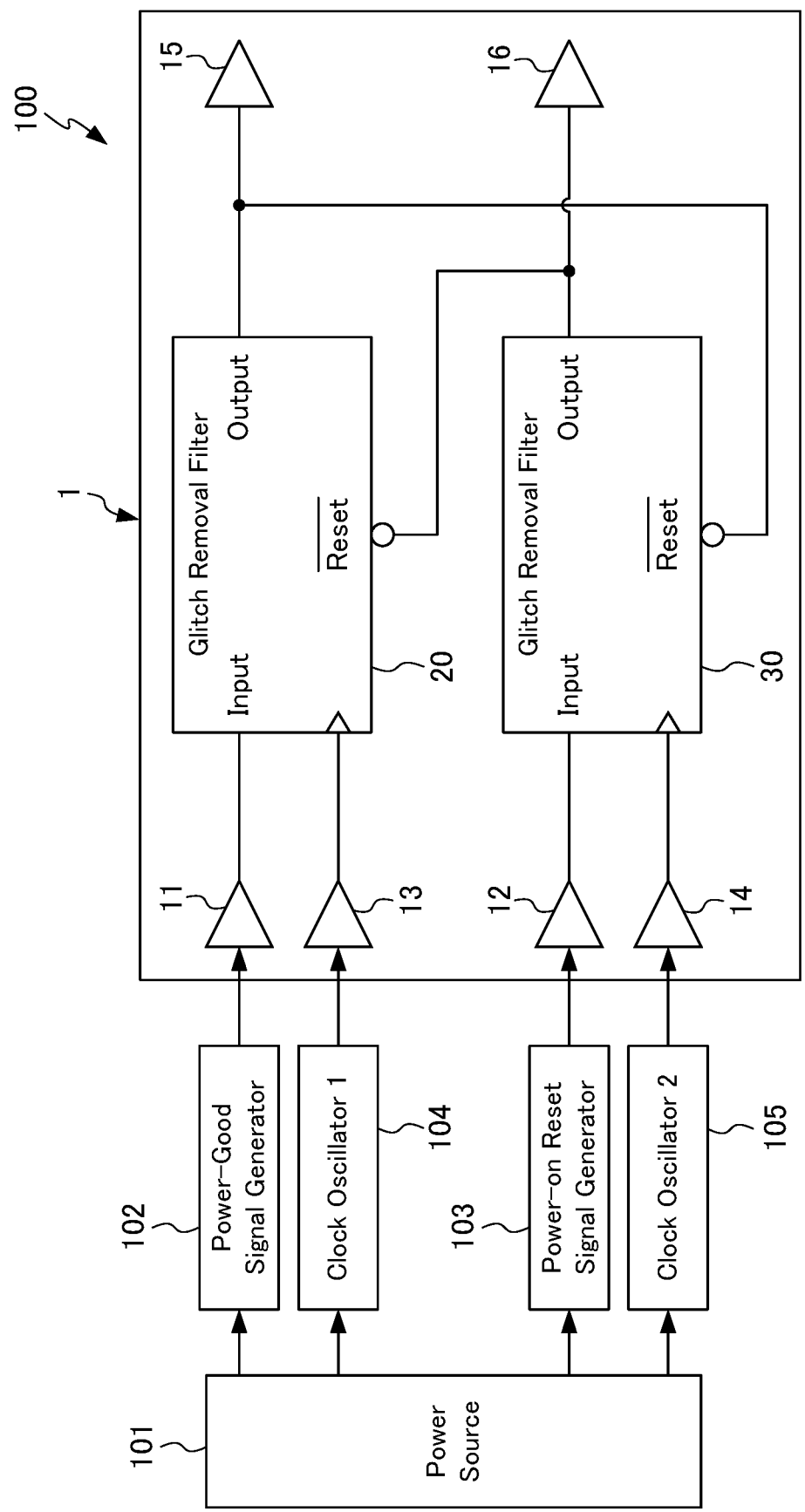
FIG. 11 is a circuit diagram showing an electronic device according to an embodiment of the present disclosure.

Furthermore, an electronic device according to an embodiment of the present disclosure will be explained. FIG. 11 is a circuit diagram showing the configuration of an electronic device 100 equipped with the glitch removal circuit 1 in FIG. 1. The electronic device 100 includes a power supply 101, Power-good output unit 102, Power-on Reset output unit 103, first clock oscillator 104, second clock oscillator 105, and the glitch removal circuit 1.

The power supply 101 generates DC voltage of a predetermined voltage (5 V, 3.3 V, etc.) from an AC primary power supply or a DC primary power supply of different voltage (e.g., 24 V), for example. A well-known DC power supply can be used as the power supply 101.

The Power-good output unit 102 is the low level immediately after turning ON the power supply, and after the output voltage of the power supply 101 reaches at least a predetermined voltage, and then a fixed time lapse, outputs the Power-good signal that is the high level. The Power-good signal outputted from the Power-good output unit 102 is inputted to the first input terminal 11 of the glitch removal circuit 1.

The Power-on Reset output unit 103 is the low level immediately after turning ON the power supply, and after the Power-good signal becomes the high level, and then a fixed time lapse, outputs the Power-on Reset signal which is the high level. The Power-on Reset signal outputted from Power-on Reset output unit 103 is inputted to the second input terminal 12 of the glitch removal circuit 1.

The first clock oscillator 104 is a clock generation source which generates the first clock signal that alternately transitions between the high level and low level cyclically. As the first clock oscillator 104, it is possible to use a crystal oscillator or the like, for example. The first clock signal outputted by the first clock oscillator 104 is inputted to the first clock terminal 13 of the glitch removal circuit 1.

The second clock oscillator 105 is a clock generation source which generates the second clock signal that alternately transitions between the high level and low level cyclically. As the second clock oscillator 105, it is possible to use a crystal oscillator or the like, for example, similarly to the first clock oscillator 104. The second clock oscillator 105 preferably generates the second clock signal independently from the first clock oscillator 104, in order to minimize the risk of the first clock signal and second clock signal stopping at the same time. In addition, the cycle of the second clock signal outputted by the second clock oscillator 105 may be the same as the cycle of the first clock signal outputted by the first clock oscillator 104, or may be different. The second clock signal outputted by the second clock oscillator 105 is inputted to the second clock terminal 14 of the glitch removal circuit 1.

The electronic device 100 can output the Power-good signal and Power-on Reset signal prepared by removing glitch noise by way of the glitch removal circuit 1; therefore, it is possible to use in order to appropriately initialize various digital circuits.

Although respective preferred embodiments of a glitch removal circuit and electronic device of the present disclosure have been explained above, the present disclosure is not to be limited to the aforementioned embodiments, and modifications are possible where appropriate.

For example, in the above-mentioned embodiments, the first delay elements 21 and second delay elements 31 are explained as D-flip flops; however, they are not limited thereto, and may be JR-flip flops or the like, for example.

In addition, in the above-mentioned embodiment, the Power-good signal is defined as positive logic, with the low level representing prior to power supply rise, and the high level representing after power supply rise; however, the Power-good signal may be negative logic. In this case, the logical circuit 22 is configured to output the logical product, and the first delay element 21 is configured to be initialized to the high level, and connects a signal produced by logically inverting the output of the first glitch removal unit to an asynchronous reset terminal of the second delay element 31. Alternatively, the logic inversion is inserted at the first input terminal 11 and first output terminal 15.

In addition, in the above-mentioned embodiments, the Power-on Reset signal is considered as negative logic, and the low level is configured to represent the reset state, and the high level to represent the reset cancel state; however, the Power-on Reset signal may be positive logic. In this case, the logical circuit 32 is configured to output the logical product, the second delay element 31 is configured to be initialized to the high level, and connects a signal produced by logically inverting the output of the second glitch removal unit to an asynchronous reset terminal of the first delay element 21. Alternatively, logic inversion is inserted at the second input terminal 12 and second output terminal 16.

EXPLANATION OF REFERENCE NUMERALS 1, 1A glitch removal circuit
11 first input terminal
12 second input terminal
13 first clock terminal
14 second clock terminal
15 first output terminal
16 second output terminal
20, 20A first glitch removal unit
21 first delay terminal
22 first logical circuit
30, 30A second glitch removal unit
31 second delay terminal
32 second logical circuit
100 electronic device
101 power supply
102 Power-good output unit
103 Power-on Reset output unit
104 first clock oscillator
105 second clock oscillator

What is claimed is:

1. A glitch removal circuit which removes glitch noise contained in a Power-good signal and a Power-on Reset signal, the glitch removal circuit comprising:
a first glitch removal unit which operates according to a first clock signal, and removes glitch noise from the Power-good signal; and
a second glitch removal unit which operates according to a second clock signal, and removes glitch noise from the Power-on Reset signal,
wherein the first glitch removal unit is configured so as to be initialized according to an output signal of the second glitch removal unit, and
wherein the second glitch removal unit is configured so as to be initialized according to an output signal of the first glitch removal unit.

2. The glitch removal circuit according to claim 1, wherein the first clock signal and the second clock signal are generated by clock generation sources which are different from each other.

3. The glitch removal circuit according to claim 1, wherein a clock signal which stabilizes prior to a rising of the Power-good signal is used as the first clock signal, and
wherein a clock signal which stabilizes prior to a negation of the Power-on Reset signal is used as the second clock signal.

4. The glitch removal circuit according to claim 1, wherein both the first clock signal and the second clock signal stabilize prior to a rising of the Power-good signal.

5. The glitch removal circuit according to claim 1, wherein the first glitch removal unit and the second glitch removal unit both have at least one stage of delay elements, and a logical circuit which outputs a logical operation result of outputs of each stage of the at least one stage of delay elements and a current input signal.

6. An electronic circuit comprising:
the glitch removal circuit according to claim 1;
a power supply;
a Power-good output unit which outputs the Power-good signal after voltage of the power supply becomes at least a predetermined value; and
a Power-on Reset output unit which outputs the Power-on Reset signal after a fixed time elapses since the Power-good signal was outputted.

* * * * *